United States Patent [19]

Ohdomari et al.

[11] Patent Number: 5,331,161
[45] Date of Patent: Jul. 19, 1994

[54] ION IRRADIATION SYSTEM AND METHOD

[75] Inventors: Iwao Ohdomari, 2-9-8, Nagahama, Kanazawa-ku, Yokohama-shi, Kanagawa, 236; Masaaki Sugimori; Junichi Murayama, both of Kanagawa; Meishoku Koh, Tokyo; Katsunori Noritake, Tokyo; Takashi Matsukawa, Tokyo; Hiroaki Shimizu, Tokyo, all of Japan

[73] Assignee: Iwao Ohdomari, Kanagawa, Japan

[21] Appl. No.: 938,611

[22] Filed: Sep. 1, 1992

[30] Foreign Application Priority Data

Mar. 6, 1992 [JP] Japan .................................. 4-084904

[51] Int. Cl.$^5$ ............................................. H01J 37/26
[52] U.S. Cl. ...................................... 250/309; 250/397
[58] Field of Search ................... 250/309, 396 R, 397, 250/398, 491.1

[56] References Cited

U.S. PATENT DOCUMENTS

| | | | |
|---|---|---|---|
| 4,063,091 | 12/1977 | Gee | 250/309 |
| 4,439,685 | 3/1984 | Plies | 250/396 R |
| 4,507,559 | 3/1985 | Plies | 250/396 R |
| 4,626,690 | 12/1986 | Todokoro et al. | 250/398 |
| 4,818,872 | 4/1989 | Parker | 250/396 R |
| 4,912,327 | 3/1990 | Waugh | 250/397 |
| 4,987,311 | 1/1991 | Devore | 250/397 |
| 5,149,976 | 9/1992 | Sipma | 250/491.1 |

Primary Examiner—Bruce C. Anderson
Attorney, Agent, or Firm—McGlew & Tuttle

[57] ABSTRACT

The present invention concerns an ion irradiation system and has for its object to provide an ion irradiation system and method which enable one or more ions to be applied to a target point with high accuracy. The ion irradiation system according to the present invention comprises: an ion microprobe; a deflector for deflecting an ion microbeam generated by said ion microprobe; a micro slit for extracting a single or predetermined number of ions from said ion microbeam deflected by said deflector; a sample holder mechanism for holding a sample to be irradiated with said single or predetermined number of ions extracted through said micro slit; a scanning electron microscope mechanism for observing the surface of said sample in real time; a secondary electron detecting system for detecting secondary electrons which are emitted from the surface of said sample, said secondary electron detecting system including a secondary electron multiplier; and an electric field control circuit for controlling an electric field which is applied to said deflector, said electric field control circuit being composed of a clock generator, a counter connected to said clock generator and a high-voltage amplifier connected to said counter and having its output connected to said deflector; wherein said counter counts output signal pulses from said secondary electron multiplier and supplies a clock signal to said high-voltage amplifier of said electric field control circuit during counting of said single or predetermined number of ions and stops the supply of said clock signal to said high-voltage amplifier upon completion of counting of said single or predetermined number of ions, whereby said ion microbeam is chopped by said deflector one or more times instantaneously reverse its direction or deflection with respect to said micro slit, thereby extracting said single or predetermined number of ions through said micro slit.

9 Claims, 15 Drawing Sheets

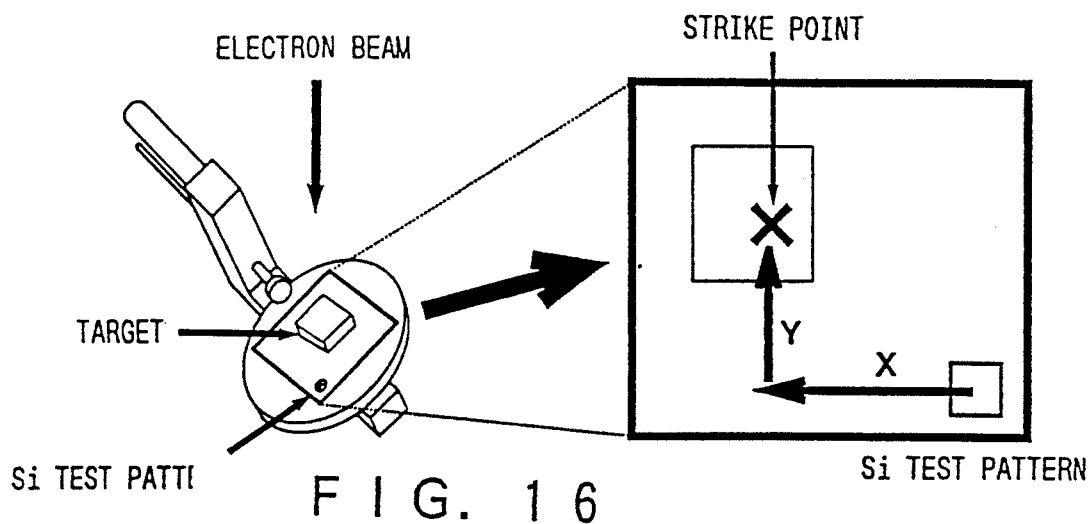
FIG. 16
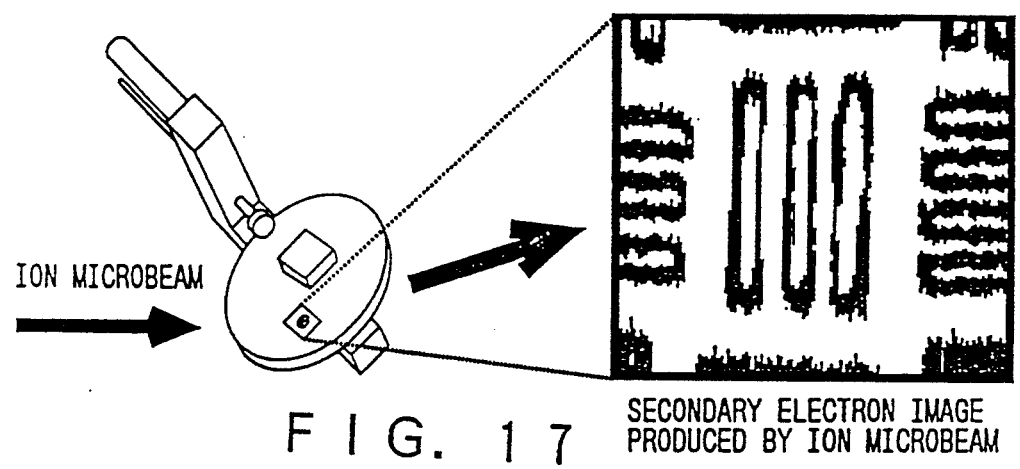
FIG. 17  SECONDARY ELECTRON IMAGE PRODUCED BY ION MICROBEAM
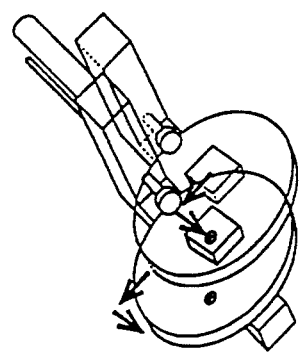
FIG. 18

ION IRRADIATION SYSTEM AND METHOD

BACKGROUND OF THE INVENTION

The invention relates to an ion irradiation system which utilizes an ion microprobe and, more particularly, to an ion irradiation system and method which permit highly accurate irradiation of a target with a single ion or predetermined number of ions placed under control.

With the progress of information processing techniques, there has been a growing demand for various satellites equipped with a variety of functions, and to meet the demand, semiconductor devices fabricated as closely-packed or high-density integrated circuits have come to be loaded on various satellites. In outer space a large number of radiant rays or cosmic rays are present, to which are exposed the semiconductor devices loaded on the various satellites, and their deterioration and temporary malfunction (such as a single event effect) by the radiant rays in outer space pose serious problems. The deterioration and temporary malfunction of the semiconductor devices by the radiant rays are likely to be caused by radioactive decay on the earth as well as in outer space, and much study is now being given to this problem in the development of closely-integrated semiconductor devices such as a DRAM (Dynamic Random Access Memory).

The integrated circuits that are loaded on an artificial satellite are subjected to very severe endurance tests prior to launching, because the circuits, once broken down, cannot be replaced after launching. In conventional irradiation tests for checking the durability of integrated circuits against high-energy ions, the integrated circuits are randomly or indiscriminately irradiated with ions over a wide area and statistics on the probability of occurrence of malfunction is compiled to thereby examine the durability of the integrated circuits against the ion irradiation. With this method, however, it is impossible to specify regions or sites where the integrated circuits are likely to malfunction, and hence the prior art lacks a decisive factor in the development of highly durable integrated circuits.

The phenomenon that is caused by the incidence of a single ion is commonly referred to as a single event. The single event gives rise to malfunction of a device, and hence constitutes an obstacle to the miniaturization or microfabrication of devices. To overcome this obstacle, it is of importance to clarify the mechanism of the single event and take preventive measures accordingly. A soft error and a latch-up are known as the device malfunction by the single event.

(i) Soft error

A dynamic random access memory (hereinafter referred to as a DRAM) stores information by storing charges in capacitors. The DRAM package contains a slight amount of radioactive substance, and if even one α (alfa) particle ($He^{2+}$) emitted from the radioactive substance enters into the DRAM, then the amount of stored charges, i.e. the stored contents will change, but the information thus changed can be restored by re-writing. Since the DRAM itself is not destroyed, this phenomenon is called a soft error. The presence of such a soft error hinders the miniaturization of the DRAM.

(ii) Latch-up

CMOS devices are now widespread as power-saving devices. The CMOS devices include many parasitic elements, and hence perform an unexpected operation according to the conditions under which they are placed. A phenomenon which is particularly liable to occur is one in which a large current flow is triggered under a certain condition, resulting in the destruction of the device. This phenomenon is called latch-up. When α (alfa) particles enter the CMOS device, electrons and holes are generated in large quantities, triggering the latch-up. The presence of the latch-up constitutes an obstacle to the miniaturization or microfabrication of the CMOS devices.

A micro ion beam (MIB) and a focused ion beam (FIB) are both focused ion beams although there is a slight difference in nuance between the two terms, and differences between them are given in the following table.

TABLE 1

| Comparison between micro ion beam and focused ion beam | | |
|---|---|---|
| | MIB | FIB |
| Ion particle | light ion | heavy ion |
| Acceleration energy | high (~MeV) | low to medium (~hundreds of keV) |
| Beam diameter | ~1 μm | tens of nm |
| Beam parallelism | parallel | nonparallel |
| Use | analysis | fine surface machining ion implantation |

FIG. 14 shows the construction of a conventional ion microprobe system, and FIG. 15 is its block diagram. In FIGS. 14 and 15, reference numeral 1 indicates a Y steerer, 2 a feedback slit, 3 a deflector, 4 a beam viewer, 5 a beam shifter, 6 a beam profile monitor, 7 a pre-slit, 8 a micro-slit, 9 a turbo pump, 10 a scraper slit, 11 a Faraday cup, 12 a quadrupole magnet lens, 13 a beam scanner, 14 a SEM column, and 15 a target chamber.

The ion microprobe system shown in FIG. 14 and a beam focusing technique are disclosed in detail in Y. Nakata, M. Sugimori, M. Ishikawa, H. Shimizu and I. Ohdomari, "Development of Ion Microprobe," Bulletin of Science and Engineering Research Laboratory, Waseda University, No. 124, pp. 20–33, 1989 and in T. Kamiyama, E. Minehara, K. Mizuhashi, Y. Nakada and I. Ohdomari, "Doublet Q-Magnet for MeV Ion Microprobe," the same bulletin as mentioned above, pp. 34–38. The beam focusing technique is a technique which focuses high-energy ion beams while retaining their parallelism. The minimum beam spot size now available is 1.9×1.7 μm.

The beam focusing technique is related to the irradiation accuracy of the ion irradiation system according to the present invention. Since a single ion that the present invention handles passes the same orbit as that of the ion beam, minimization of the beam spot size is needed to ensure accurate irradiation.

The ion beam is made flat by use of a slit, which is operated in the same manner as that in which the aperture of a lens is stopped down. The aperture of an objective slit is made as small as possible so that it can be regarded as a point light source. (The opening of the objective slit can be adjusted by increments of 1 μm.)

Ion microbeams, which are high-energy charged particle beams having their diameters reduced down to several submicrons, have already been employed as means for an elemental analysis or the like at more than twenty places throughout the world. Much effort has been devoted, in particular, to increasing an ion current in order to obtain better statistics. However, increased ion current density now poses a serious problem because of radiation damage to the sample which is caused by a concentrated application of ions to an extremely limited area of the sample.

To reduce the radiation damage to the minimum, the prior art ion microprobe uses a high-resolution, high-efficiency radiation detector, and the conventional ion irradiation system is provided with a scanning electron microscope (SEM) so that it is capable of irradiation by both of the ion microbeam and an electron beam.

The ion irradiation system has been developed primarily for investigating the effect of irradiation of the sample by high-energy charged particles. A technique for controlling ions to strike the sample at a specified point is now being developed in GSI of Germany as well, but it does not include control of the number of incident ions. Besides, an experiment which uses radioisotopes such as $^{241}$Am is also conducted to examine the effect of irradiation by a small number of ions, but in this case the position of incidence of ions on the sample cannot be decided and ions of arbitrary energy cannot be obtained either.

FIG. 16 through 18 are schematic diagrams for explaining techniques for directing the above-mentioned collimated ion microbeam to the target position or point on the sample surface.

A first step is to detect the positional relationship between a reference position and the target position by means of the scanning electron microscope (SEM) (FIG. 16). The next step is to move the sample holder of table so that the ion beam strikes at the reference position (FIG. 17), followed by moving the sample holder by the distance based on the detected positional relationship to bring the target position into coincidence with the reference position (FIG. 18). Thus, the ion beam can be applied to the sample at the desired strike position.

A fine-structured silicon (Si) test pattern is placed at the reference position. FIG. 19 shows an SEM image of the silicon test pattern.

The pattern is composed of lines and spaces (0.5 to 5.5 $\mu$m wide) and is designed to permit measurement of both of the position of incidence of the ion beam and the beam spot size. Such a computer output as shown in FIG. 19 is obtained by scanning the ion beam. In this instance, if two adjacent lines can be distinguished from each other, then the ion beam spot size is estimated to be equal to the space defined by the two lines therebetween.

As mentioned above, the silicon test pattern has two functions, i.e. a standard of the beam spot size and a reference position for aiming the ion beam at a specified point. The above-noted aiming technique is needed because direct irradiation of the sample with the ion beam will cause damage to the sample and hence is not preferable.

A description will be given hereunder of the prior art which are related to the ion irradiation system and method according to the present invention.

Techniques for the detection of the beam spot size and its position of incidence for the ion microprobe system are disclosed in M. Sugimori et al., "Beam size and beam site detecting system for ion micro probe," Proc. of '89 Autumn Meeting of the Applied Physics Society of Japan, 29a-H-2, pp. 494. To facilitate the detection of the spot size and position of incidence of the ion beam, the detecting system set forth in the above prior art literature utilizes a target chamber provided with a scanning electron microscope (SEM) so that a secondary electron image by the ion beam and an SEM image are observed in the same target chamber. This system uses, as the test pattern, a fine-structured relief test pattern formed on a silicon chip and detectes the spot size and position of incidence of the ion beam by comparing the secondary image and SEM image of the silicon test pattern. By rotating the sample holder, the sample is set at 90 degrees to the electron beam during observation of the SEM image and similarly set at 90 degrees to the ion beam during radiation of ions. That is, the rotational angle of the sample holder is variable. With this detecting system, a 1 $\mu$m pattern can be observed with high resolution.

The measurement of the beam size is disclosed in T. Kamiya et al., "Beam Size Measurement for MeV Ion Microbeam System," Proc. of '91 Spring Meeting of the Applied Physics Society of Japan, 29p-ZD-11, pp. 547. Kamiya et al. measured the beam size by use of an He+-beam of 3 MeV in order to evaluate the performance of a microbeam unit mounted on a 1.7 MV tandem accelerator. Experiments reveal that it is effective in measurement of the beam spot size to employ a method which detects secondary electrons which are generated by scanning with a microbeam a fine-structured silicon relief test pattern fabricated by semiconductor machining techniques. As the result of a preliminary measurement, a beam spot size of $1.7 \times 1.9$ $\mu$m$^2$ was obtained.

A beam aiming technique is disclosed in M. Koh et al., "Beam site control system for micro ion beam," Proc. of '91 Spring Meeting of the Applied Physics Society of Japan, 29p-ZD-12, pp. 547. The disclosed system employs a target chamber with a scanning electron microscope (SEM) and applies as ion beam and an electron beam to a fine-structured silicon relief test pattern to obtain its secondary electron images, from which the position of irradiation is detected. Positioning control for irradiation is effected by (a) detecting a reference irradiation point, i.e. the position of the sample and then (b) transferring the sample holder and irradiating the sample with the ion beam.

The above-mentioned beam aiming technique has the following advantages:

(1) It has been confirmed that the spot size of and He+beam (3 MeV) can be reduced by the edging effect to $1.7 \times 1.9$ $\mu$m$^2$.

(2) It is possible to carry out real-time observations of a secondary electron image by the ion beam on the SEM display screen and perform image processing by a computer.

(3) It is possible to observe an ultra-fine relief test pattern (which consists of lines and spaces 0.5-5.5 $\mu$m wide) and effect high-speed, simple irradiation position control, using the fine relief test pattern as a reference position.

The concept of the single ion irradiation system is set forth in J. Murayama, et al., "Development of Single Ion Hitting System," 1990 Autumn Meeting of the Applied Physics Society of Japan, Proceedings, 27p-Y-1. The single ion irradiation system disclosed in this literature is formed by an ion microprobe and a beam chopper. The beam chopper includes a slit, a deflector and an electric field control circuit and is used to extract a single ion from an ion microbeam.

The single ion irradiation system operates following the procedure mentioned below.

(1) The ion beam is aligned and the position of irradiation is determined.

(2) A bias voltage is applied to the deflector to deflect the ion beam to prevent it from passage through the slit.

(3) After a certain elapsed time a reverse bias is applied to the deflector to deflect the ion beam in the reverse direction. The thus reverse-deflected beam is also prevented from passing through the slit. (At this instant a single ion is extracted.)

(4) Secondary electrons from the target are detected and the quantity of radiation is identified.

However, the Murayama et al. literature does not confirm the extraction of a single ion nor does it disclose the entire structure of a concrete ion irradiation system and a specific method of extraction of a single ion or predetermined number of ions. Further, the literature makes no mention of specific conditions for extracting a single ion or desired number of ions with a high degree of accuracy.

Moreover, the extraction of a single ion by chopping an ion beam had not been ascertained experimentally. But the inventors of the subject application have now ascertained the extraction of a single ion; namely, they have succeeded in experimentally extracting a single ion and a predetermined number of ions with accuracy. The present invention concerns an ion irradiation system and method for obtaining a single ion and a predetermined number of ions.

Experimental data on the extraction of a single ion is disclosed in the inventors' report, "Singularity Estimation of Ions Extracted by Chopping Ion Beam," Proc. of '91 Autumn Meeting of the Applied Physics of Japan, 12p-ZB-5, pp. 591. Furthermore, the irradiation of CMOS ICs with ions is reported by the inventors' in "Mapping of Radiation Immunity on CMOS Devices," Proc. of the above-noted meeting, 12p-ZB-6.

SUMMARY OF THE INVENTION

The "Single ion" mentioned herein refers to an ion which forms for a predetermined period of time immediately after an ion microbeam generated as an ion stream by use of a conventional ion microprobe passes through a single ion generating slit.

The present invention is a combination of a single ion generating system and a single ion aiming system with the known ion microprobe. There has been proposed a technique whereby an ion microbeam stream produced by the known ion microprobe is aimed at a predetermined position on a target with the accuracy of an optical microscope, but nothing has been proposed regarding a single ion irradiation system for applying a single ion or predetermined number of ions, not the ion microbeam stream, to a specified position of the order of micrometers or less with a high degree of accuracy.

The concepts underlying the present invention is (1) to focus a high-energy ion beam (a ion microprobe technique), (2) to direct the ion beam to a target position (an aiming technique) and (3) to apply ions one by one to the target (a single ion irradiation technique).

An object of the present invention is to provide an ion irradiation system and method for obtaining guidelines for enhancement of radiation immunity of semiconductor devices.

Another object of the present invention is to provide an ion irradiation system and method which enable one or desired number of ions to be extracted from an ion microbeam and applied to a target position with high accuracy.

Another object of the present invention is to provide an ion irradiation system and method which permit accurate extraction of a predetermined number of ions from an ion microbeam.

Another object of the present invention is to provide an ion irradiation system and method for extracting a single ion from an ion microbeam.

Another object of the present invention is to provide an ion irradiation system and method which permit extraction of one or desired number of ions through a slit by setting the number of chopping for deflecting an ion microbeam, the slit width, a beam current and the beam spot to predetermined values.

Another object of the present invention is to provide an ion irradiation system and method which employ a novel field control circuit (or beam chopper circuit) for an ion beam deflector.

Another object of the present invention is to provide an ion irradiation system and method which employ a goniometer in a sample holding mechanism.

Another object of the present invention is to provide an ion irradiation system and method which selectively use single ions not only of $H^+$, $He^+$ and $He^{2+}$ but also other ions of such as rare gas ions and metal ions by selecting ion sources.

Another object of the present invention is to provide an ion irradiation system and method which uses a SEM mechanism for real-time observation of the sample surface in a secondary electron detection system.

Another object of the present invention is to provide an ion irradiation system and method in which a sample to be irradiated with a single or desired number of ions, or a sample holding mechanism for holding the sample includes a reference point.

Another object of the present invention is to provide an ion irradiation system and method which employ the above-mentioned reference point a ultrafine-structured silicon (Si) test pattern for measuring the position of incidence of a beam on the sample and the beam spot diameter.

Another object of the present invention is to provide an ion irradiation method which employs a novel method for deflecting an ion microbeam.

Still another object of the present invention is to provide an ion irradiation method which repeats the deflection of an ion microbeam if no single ion is detected.

The ion irradiation system and method according to the present invention feature an ion generating technique for accurately extracting one or a desired number of ions from an ion beam. This technique can be implemented when combined with the known beam focusing and aiming techniques, and its constituent features are chopping of an ion microbeam for deflection thereof for extracting a single ion, the width of a single ion generating slit, and ion microbeam current and the beam spot diameter. As the result of experiments for properly selecting these constituent features, the inventors of the subject application have found conditions for accurately extracting a single ion from an ion microbeam. At the same time, it has become possible to accurately extract a desired number of ions.

While there have not been proposed a system and a method for accurately extracting a single or desired number of ions, the present inventors have found and ascertained such an ion extracting method experimentally. The technique for accurately generating a single or desired number of ions has not been known in the past nor could it easily be obtained even by a combination of conventional techniques.

Then the present inventors propose a system configuration and method for generating a single ion. By combining an ion microprobe utilizing the known beam focusing technique with the ion aiming technique which ensures the application of an ion stream to a target point, the ion irradiation system and method are established which accurately extract a single or desired number of ions from an ion beam and apply the single or desired number of ions to the target point with precision.

The ion irradiation system according to an aspect of the present invention (FIGS. 1, 2 and 7) comprises:

an ion microprobe (FIGS. 14 and 15);

a deflector 3 for deflecting an ion microbeam generated by said ion microprobe;

a micro slit 8 for extracting a single or predetermined number of ions from said ion microbeam deflected by said deflector;

a sample holder 28 mechanism for holding a sample to be irradiated with said single or predetermined number of ions extracted through said micro slit;

a scanning electron microscope mechanism for observing the surface of said sample in real time;

a secondary electron detecting system for detecting second electrons which are emitted from the surface of said sample, said secondary electron detecting system including a secondary electron multiplier 20; and an electric field control circuit 16 for controlling an electric field which is applied to said deflector 3, said electric field control circuit 16 being composed of a clock generator 17, a counter 18 connected to said clock generator 17 and a high voltage amplifier 19 connected to said counter 18 and having its output connected to said deflector 3;

wherein said counter 18 counts output signal pulses from said secondary electron multiplier 20 and supplies a clock signal to said high-voltage amplifier 19 of said electron field control circuit 16 during counting of said single or predetermined number of ions and stops the supply of said clock signal to said high-voltage amplifier 19 upon completion of counting of said single or predetermined number of ions, whereby said ion microbeam is chopped by said deflector one or more times to instantaneously reverse its direction of deflection with respect to said micro slit 8, thereby extracting said single or predetermined number of ions through said micro slit 8.

According to another aspect of the present invention, the ion irradiation system extracts one or a desired number of ions through the micro-slit by setting the number of chopping the ion microbeam, the width of the micro-slit, the beam current of the ion microbeam and the beam spot size to predetermined values.

According to another aspect of the present invention, the ion irradiation system has a construction in which the sample holding mechanism includes a goniometer which has a positioning accuracy of 1 μm or less and six axes (x, y, z, $\theta_x$, $\theta_y$, $\theta_z$).

According to another aspect of the present invention, the ion irradiation system has a construction in which said scanning electron microscope mechanism comprises;

a scanning electron microscope 21 including a preamplifier 29 connected to the output of said secondary electron multiplier 20, a scanning electron microscope monitor 30 and a screen scanning signal generator;

a beam scanning unit 31 having a beam scanning power supply 27 supplied with the one screen scanning signal from said screen scanning signal generator, for continuously scanning said ion microbeam;

a scanner deflector 13 connected to said beam scanning unit 31; and a scanning electron microscope column 14 supplied with the other screen signal from said screen scanning signal generator, for generating an electron beam.

wherein said secondary electron detecting system comprises;

a low-pass filter 22 having its input connected to the output of said preamplifier 29 connected to said secondary electron multiplier 20 and having its one output connected to said scanning electron microscope monitor 30;

an amplifier 23 having its input connected to the other output of said low-pass filter 22;

an A/D converter 24 connected to said amplifier 23;

a computer system 25 connected to said A/D converter 24; and a D/A converter 26 having its input connected to said computer system 25 and having its input connected to said computer system 25 and having its output connected to said beam scanning power supply 27;

wherein said scanning electron microscope mechanism (29, 30, 21, 27, 31, 13, 14) detects, in real time, an image formed by secondary electrons emitted from the surface of said sample by its irradiation with said electron beam from said scanning electron microscope column 14 or said ion microbeam from said ion microprobe; and wherein said secondary electron beam detecting system (20, 22, 23, 24, 25, 26, 27) detects secondary electrons, said secondary electrons emitted from said sample surface by its irradiation with said electron beam, said ion microbeam and said single or predetermined number of ions.

According to another aspect of the present invention, the ion irradiation system has a construction in which the sample to be irradiated with the single ion or the sample holder mechanism includes a reference point which is used by the SEM mechanism to obtain the positional relationship between an irradiation reference position and the position on the sample surface desired to irradiate with the single ion.

According to another aspect of the present invention, the ion irradiation system employs, at the reference position, a ultrafine-structured silicon test pattern for measuring the position of incidence of the ion microbeam and the beam spot diameter.

According to another aspect of the present invention, an ion irradiation system which comprises: an ion microprobe (FIGS. 14 and 15);

a deflector 3 for deflecting an ion microbeam generated by said ion microprobe;

a micro slit 8 for extracting a single or predetermined number of ions from said ion microbeam deflected by said deflector;

a sample holder mechanism 28 for holding a sample to be irradiated with said single or predetermined number of ions extracted through said micro slit;

a scanning electron microscope mechanism for observing the surface of said sample in real time;

a secondary electron detecting system including a secondary electron multiplier, for detecting secondary electrons emitted from said sample surface;

and an electric field control circuit 16 for controlling an electric field which is applied to said deflector 3, said electric field control circuit 16 being composed of a clock generator 17, a counter 18 connected to said clock generator and a high-voltage amplifier 19 connected at its input to said counter 18 and at its output to said deflector 3, and wherein said counter 18 counts output signal pulses from said secondary electron multiplier 20 and supplies field control circuit 16 during counting of said single or predetermined number of ions and stops the supply of said clock signal to said high-voltage amplifier 19 upon completion of counting of said single or predetermined number of ions, whereby said ion microbeam is chopped by said deflector one or more times to instantaneously reverse its direction of deflection with respect to said micro slit 8 to thereby extract therethrough said single or predetermined number of ions;

said method comprising:

a first step of observing a secondary electron image over said sample surface through electron scanning by said scanning electron microscope mechanism to detect the positional relationship between a position of said sample surface desired to irradiate with said single or determined number of ions and a reference position on said sample or sample holder mechanism;

a second step of observing a secondary electron image at said reference point through ion microbeam scanning by said scanning electron microscope mechanism to determine the position for ion irradiation of said sample;

a third step of moving said sample holder mechanism by a distance based on said positional relationship detected in said first step to bring said position for ion irradiation of said sample into agreement with said position of said sample surface-where to irradiate;

a fourth step of applying a bias voltage to said deflector from said electric field control circuit to chop said ion microbeam to permit the passage of said single or predetermined number of ions through said micro slit for only an extremely short period of time during which said ion microbeam is deflected across said micro slit widthwise thereof; and a fifth step of detecting secondary electrons emitted from said sample surface by irradiation with said single or predetermined number of ions to count the number of ions incident to said sample surface.

According to another aspect of the present invention, the ion irradiation method repeats said third and fourth steps until the number of ions passing through said micro slit 8 reaches a predetermined number when the probability of ions passing through said micro slit is so low that even a single ion is not allowed to pass through said micro slit by one reversal of the direction of deflection of said ion microbeam.

According to still another aspect of the present invention, the ion irradiation method employs a ultrafine-structured silicon test pattern which is placed at the reference position for measuring the position of incidence of the ion microbeam on the sample surface and the beam spot size.

The single ion irradiation system according to the present invention is based on the following three techniques:

I) Beam focusing technique
II) Aiming technique
III) Single ion generating technique The beam focusing and aiming techniques are known techniques developed jointly by an Ohdomari's group, Waseda University and Japan Atomic Energy Research Institute, Takasaki, and the single ion generating technique is one that was developed independently by the inventors of this application.

A description will be given of the principle of the single ion generating technique for extracting one or predetermined number of ions according to the present invention.

This technique is to extract a single ion from an ion beam by use of an ion extractor, which is composed of a beam deflecting electrode plate and a slit and extracts a single ion by the following steps of:

I) applying a bias to the deflector to deflect the ion beam to intercept it by the slit, II) instantaneously inverting the polarity of the bias applied to the deflector to deflect the ion beam in the reverse direction, whereby a very small number of ions pass through the slit the instant the ion beam is deflected across a centrally-disposed opening of the slit;

III) measuring the number of secondary electrons which are emitted from the target and estimating the number of ions having irradiated the target; and IV) repeating the steps I) through III) in the case where the probability of ions passing through the slit is so low that no ion is applied to the target by one reversal of the direction of deflecting the ion beam.

In this way, a single ion can be extracted. The ion thus extracted follows the same path as does an ion beam, and hence can be applied with tolerances less than around 1 $\mu$m. In general, when the sample is irradiated with the ion, secondary electrons are emitted from the sample and the incidence of the ion to the sample is detected by detecting the secondary electrons.

BRIEF DESCRIPTION OF THE DRAWINGS

FIG. 16 is a schematic diagram for explaining the principle of positioning an ion microbeam;

FIG. 17 is a schematic diagram for explaining the principle of positioning an ion microbeam;

FIG. 18 is a schematic diagram for explaining the principle of positioning an ion microbeam.

DESCRIPTION OF THE PREFERRED EMBODIMENTS

With the progress of semiconductor microfabrication techniques and telecommunication technique, microminaturization of semiconductor devices and enhancement of their functions are now being advanced. A structural analysis of semiconductor devices calls for a system for irradiating a microscopic area with ions and the evaluation of the radiation immunity of semiconductor devices which are loaded on various satellites such as telecommunication satellite requires a single ion irradiation apparatus and method. The present invention is directed to a single ion irradiation system and method for applying one ion to a target point with high accuracy.

Figure 14:
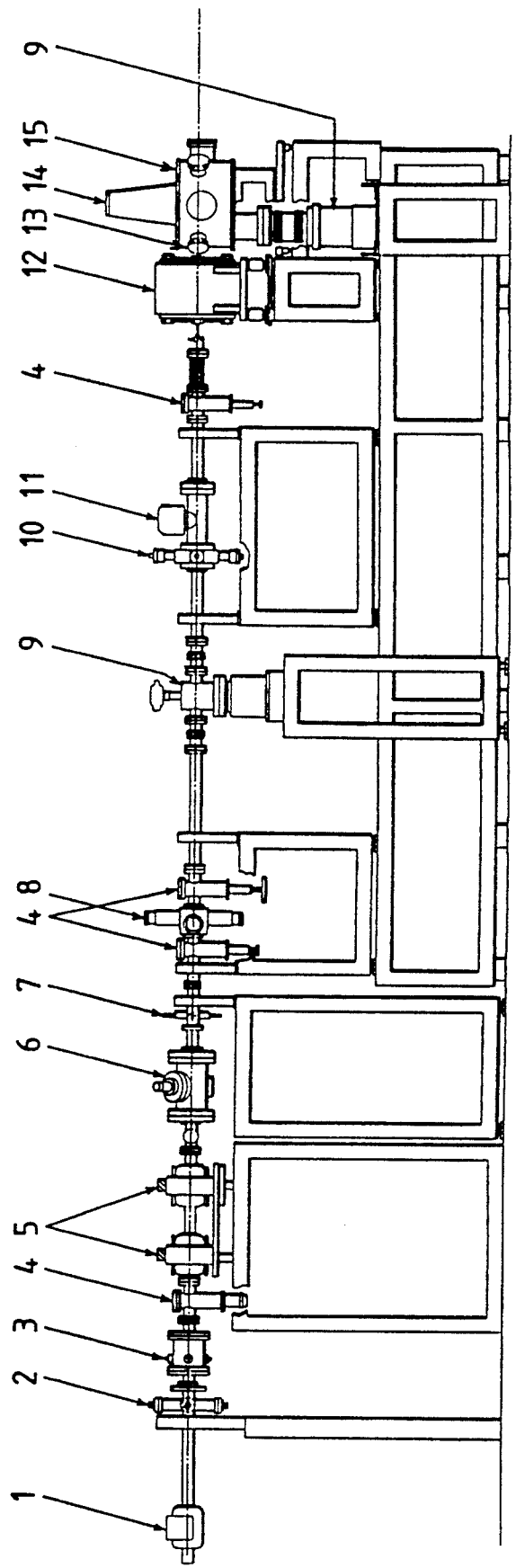
FIG. 14 is a schematic diagram illustrating a conventional ion microprobe.
Figure 15:
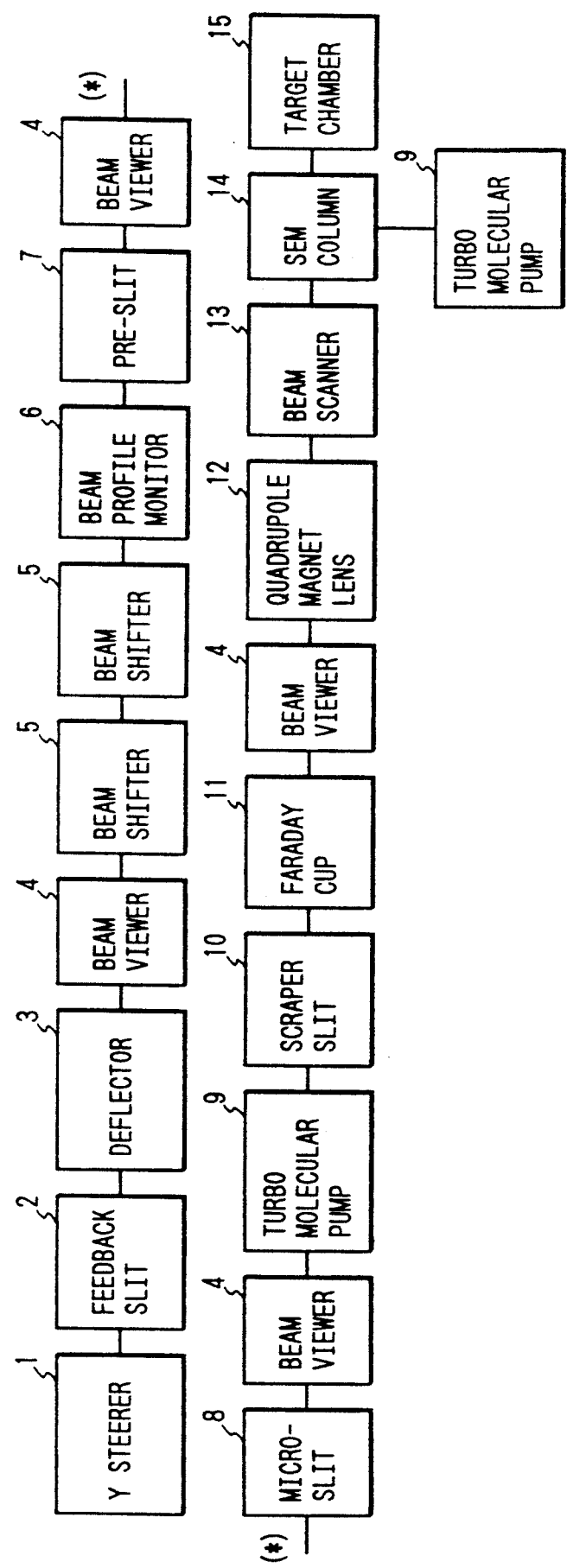
FIG. 15 is a block diagram of the conventional ion microprobe.
Figure 19:
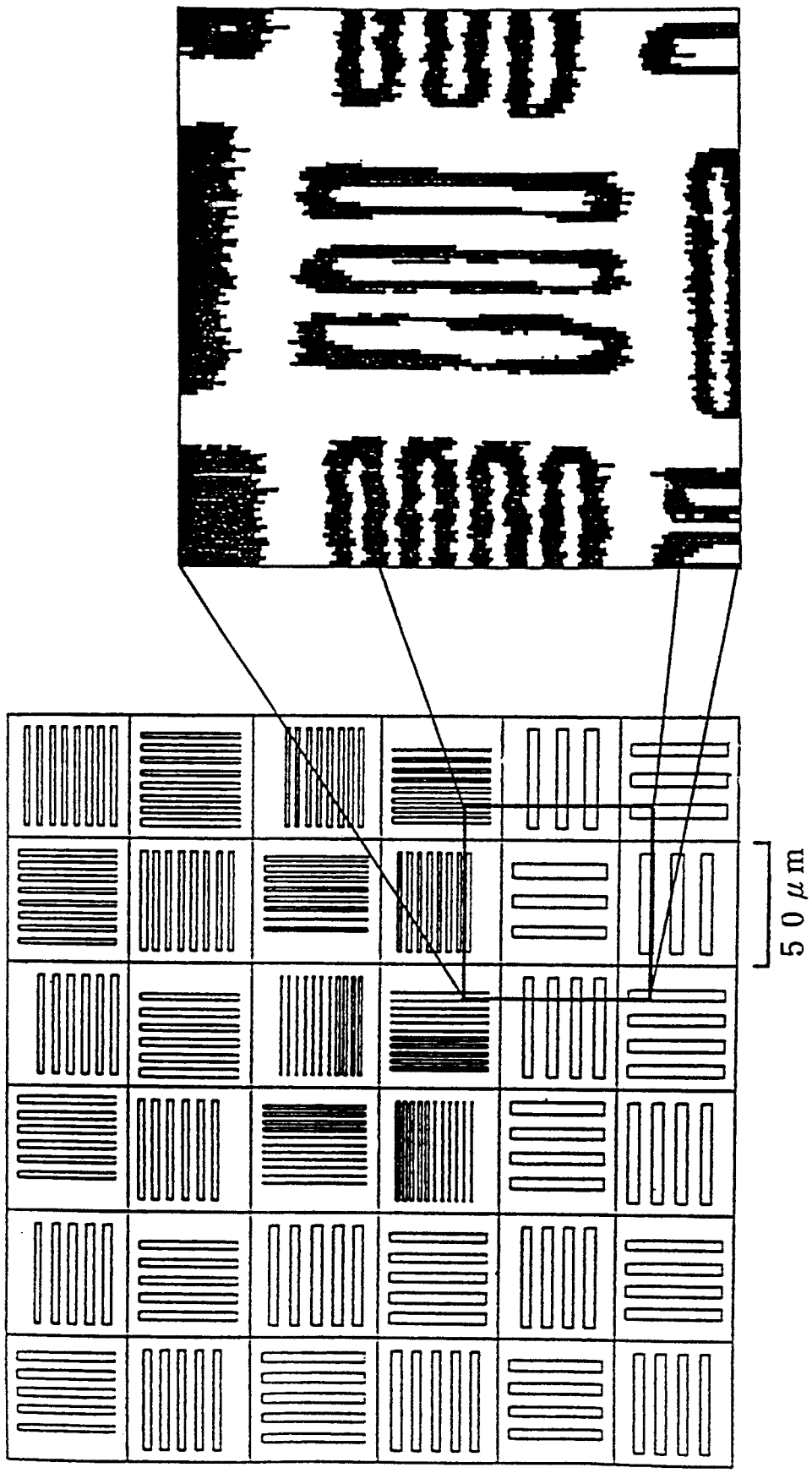
FIG. 19 is a diagram showing an SEM image of a silicon test pattern.

The ion irradiation system according to the present invention has been developed on the basis of an ion microprobe (FIGS. 14 and 15). The ion microprobe used in the present invention is identical in construction with that shown in FIGS. 14 and 15. However, a deflector 3, a micro-slit 8, a SEM column 14, a target chamber 15, beam chopper circuit 16, SEM mechanism secondary electron detecting system and a feedback-loop line from the secondary electron detecting system to the counter circuit 18 in the beam chopper circuit 16 are adapted for extracting single ions.

The present invention permits accurate application of one ion to a target position through utilization of the following three techniques:

1) Beam focusing technique;
2) Aiming technique; and
3) Single ion generating technique.

The beam focusing technique is one that focuses a high-energy ion beam by means of a quadrupole magnet lens. This technique ensures accurate application of the ion beam. The following is the performance of the ion microprobe in the ion irradiation system according to the present invention.

Ion: $H^+$, $He^+$, $He^{2+}$

Maximum energy: 3.4 MeV ($H^+$, $He^+$), 5.1 MeV ($He^{2+}$)

Minimum beam spot diameter: $1.9 \times 1.7$ $\mu m$

Incidentally, the present invention is not limited specifically to the above-mentioned ions but may employ rare gases such as argon (Ar) and neon (Ne), and other ions by suitably selecting an ion source.

Principle of the Single Ion Irradiation System

Figure 1:
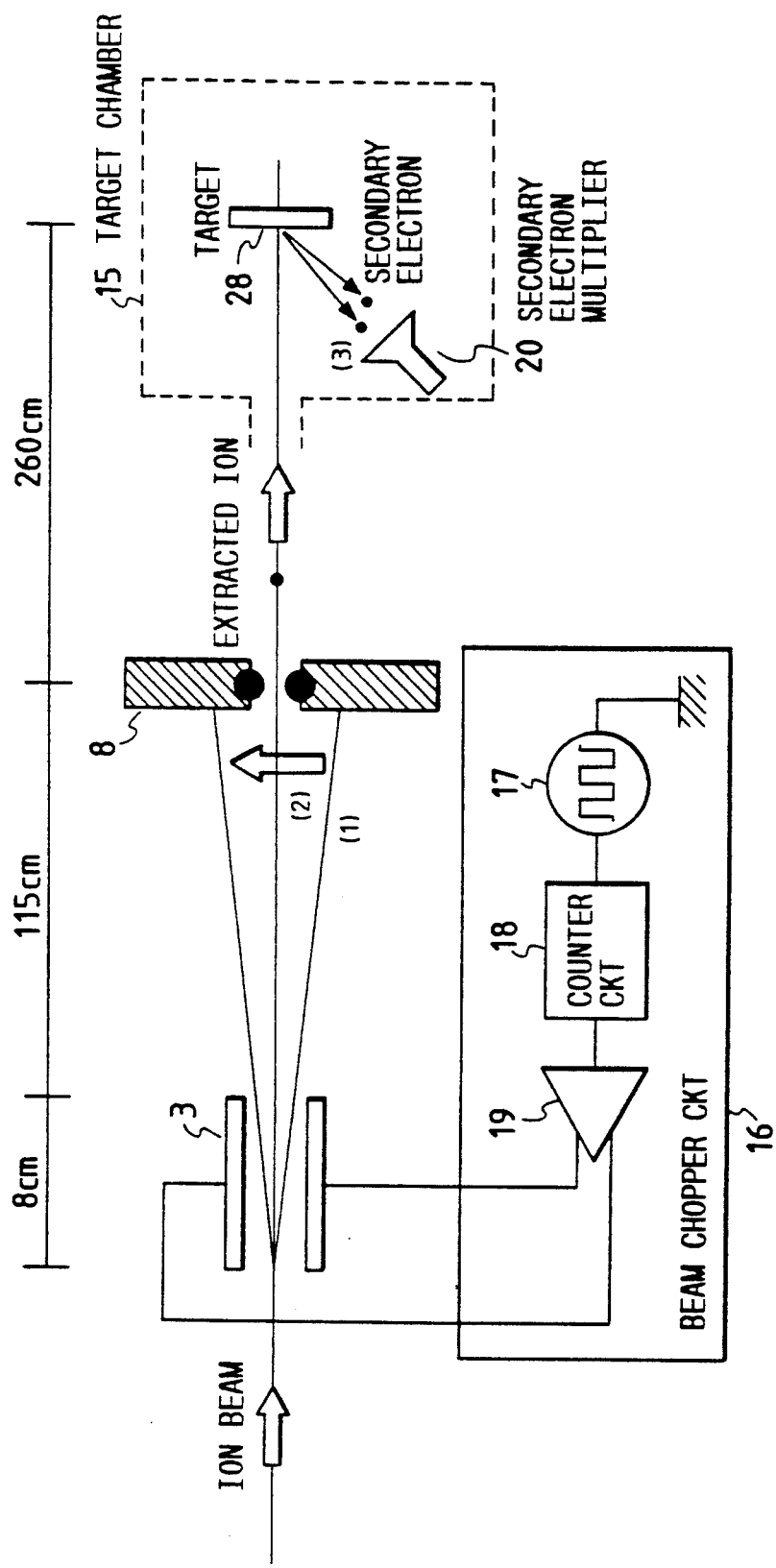
FIG. 1 is a schematic diagram showing the principle of the ion irradiation system according to the present invention.
Figure 2:
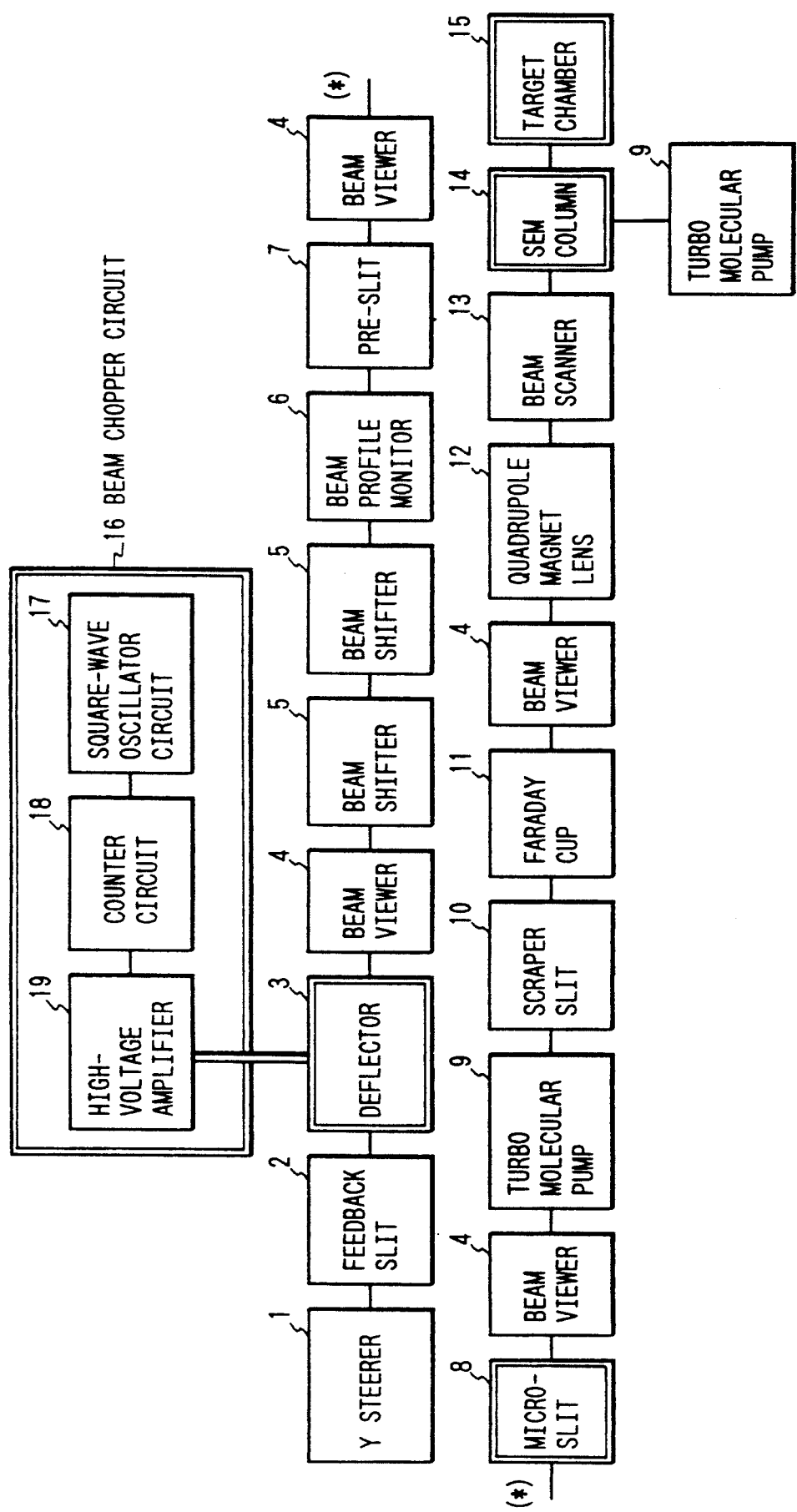
FIG. 2 is a block diagram of the ion irradiation system according to the present invention.

FIG. 1 illustrates the basic construction of the single ion irradiation system according to the present invention, and FIG. 2 is its block diagram. As compared with the conventional ion microprobe depicted in FIG. 15, the single ion irradiation system according to the present invention features the deflector 3, the micro-slit 8, the beam chopper circuit 16, the SEM column 14, the target chamber 15, SEM mechanism, secondary electron detecting system and a feedback-loop line from the secondary detecting system to counter circuit 18. The procedure of operation of this system will be described below with reference to FIGS. 1 and 2.

(1) The procedure starts with applying a bias to the deflector 3 to deflect an ion beam so that it is intercepted by the micro-slit 8.

(2) The next step is to momentarily invert the polarity of the bias being applied to the deflector 3. As a result, the ion beam is deflected in the reverse direction and is intercepted again by the micro-slit 8, but the instant the ion beam is deflected across the centrally-disposed opening of the micro slit 8, a very small number of ions pass through the micro-slit 8.

(3) The number of ions having reached or bombarded the target is evaluated using a solid-state detector (SSD) directly as the target or by counting the number of secondary electrons emitted from the target.

(4) In the case where the probability of ions passing through the micro-slit 8 is so low that even one ion is not applied to the target by one reversal of the direction of deflection of the ion beam (i.e. by one chopping), the steps (1) through (3) are repeated.

In the system of the present invention, the deflector 3, the micro-slit 8 and the secondary electron multiplier 20 are the same as those used in the prior art. The deflector 3 is formed by a pair of opposed deflecting plates, which are, for example, 8 cm long and spaced 6 mm apart. The micro-slit 8 is one that is formed by providing a slit directly in the spindle of a differential micrometer and has a resolution of 1 $\mu m$. The micro-slit 8 is circular so as to minimize scattering of ions therein as shown in FIG. 1.

The beam chopper circuit 16 is the most important element for irradiating a target with a single ion which is extracted by momentarily reversing the direction of deflection of the ion beam (i.e. by beam chopping). For implementation of the irradiation with a single ion, an ordinary electric field control circuit designed, taking only the input/output linearity into account, is too slow in response. In view of this, the electric field control circuit 16 used in the present invention is adapted to ensure irradiation with single ions by suitable setting of various conditions.

FIG. 1 includes a secondary electron multiplier 20 and a counter circuit 18. The secondary electron multiplier 20 detects secondary electrons from the target. The feedback loop line is also provided from the secondary electron multiplier 20 to the counter circuit 18. The counter circuit 18 is included in the subject matter of the invention disclosed in the originally filed specification and is a constituent feature indispensable to controlling a single or desired number of ions.

The function of irradiating the target with one or desired number of ions is implemented by applying a bias to the electrode of the deflector 3 in FIG. 1 to cut off an ion beam, through use of the output from the secondary electron multiplier 20 in the ion irradiation system.

In FIG. 1 the beam chopper circuit 16 includes a counter circuit 18. As will be seen from FIG. 1, the counter circuit 18 has a mechanism or function for controlling the ion beam chopping by counting the output signal pulses from the secondary electron multiplier 20.

Now, a description will be given of the function of the counter circuit 18. The counter circuit 18 counts the number of output signal pulses from a secondary electron multiplier 20 and, during counting of one or a present number of ions, sends a clock signal or signals from the clock generator circuit 17 to a high-voltage amplifier 19 in the beam chopper circuit 16. Incidentally, the secondary electron multiplier 20 generates about one shot of background noise per minute. The generation of the background noise is attributable to the emission of thermionic emitted electrons from the inner wall of the vacuum target chamber 15 and the secondary electron multiplier 20 itself, and the background noise is generated regardless of the ion irradiation by beam chopping. Hence, merely simple counting of the number of output signal pulses from the secondary electro multiplier 20 will lead to a misjudgment of the ion extraction. To avoid this, the counter circuit 18 has the function described below, which is intended to count only secondary electrons that are caused by the incidence of a single ion or the desired number of ions.

In the case of ion radiation, the number of ions radiated is preset in the counter circuit 18, which outputs a "1" until the end of counting. As a result, the counter circuit 18 provides a clock signal intact to a high-voltage amplifier 19. Now, let the time for beam chopping (i.e. the reversal of the beam orbit) be represented by $t_{sw}$. Then, an ion will be extracted in the time $t_{sw}$ after the rise of the clock signals and the counter circuit 18 utilizes this fact to count only output pulses from the secondary electron multiplier 20 within the time $t_{sw}$ after the rise of the clock signal, through use of a one-shot timer function in the counter circuit 18. That is, the one-shot timer function of the counter circuit 18 is started by the rise of the clock signal and only while the clock signal output is a "1", secondary electron counted pulses are given to the counter circuit 18, which, after counting a predetermined number of such the secondary electron detected pulses, outputs a "0", stopping the clock output to the high-voltage amplifier 19.

Beam Chopper Circuit Construction

Figure 3:
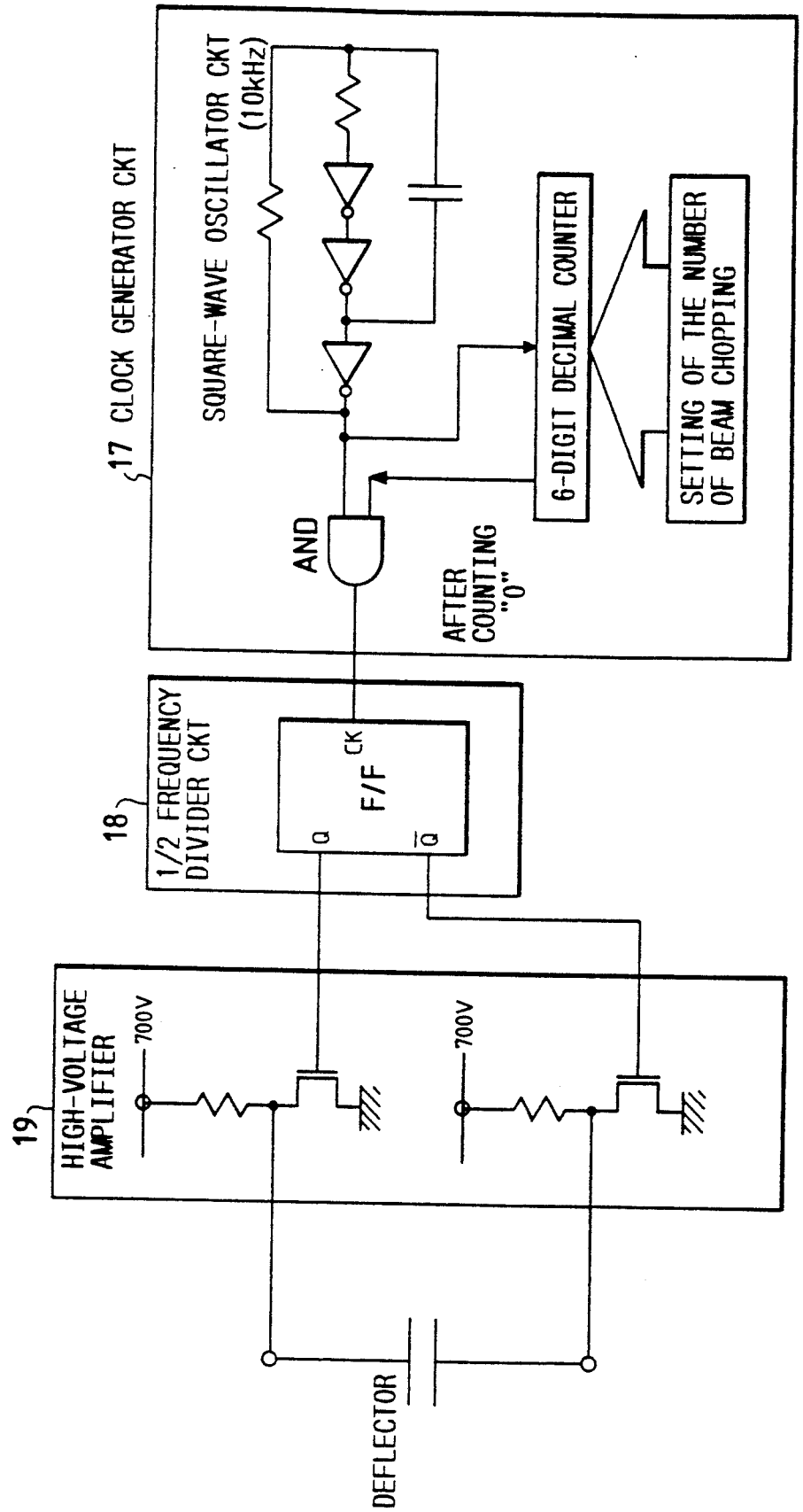
FIG. 3 is a block diagram of a beam chopper circuit for use in the present invention.

FIG. 3 illustrates the overall construction of the beam chopper circuit 16. A square-wave oscillator circuit 17 is composed of inverters, resistors and a capacitor, and its oscillation frequency is dependent on the values of the resistors and the capacitor.

The output of the square-wave oscillator circuit 17 is applied to a counter circuit, which counts input square waves by a preset number and outputs a "1" during counting. By ANDing the outputs of the counter and the oscillator, it is possible to output pulses equal to the number preset in the counter.

The pulse output is provided to a flip-flop in a ½ frequency divider circuit 18. When the input pulse undergoes a change of one cycle "1"→"0"→"1" the flip-flop toggles only once from the "0" state to the "1" state or vice versa. Accordingly, one cycle of input pulse can be made to correspond to one beam chopping operation. The flip-flop has two 180° out-of-phase outputs (Q, Q̄), and by amplifying them intact, a two-fold amplitude can be obtained with a differential output.

The 180° out-of-phase outputs are applied to a high-voltage amplifier 19, which is composed of switching circuits each formed by a MOSFET. Amplifiers, which are supplied with the 180° out-of-phase outputs, are capable of outputting voltages in the range of 0 to 700 V, and the high-voltage amplifier 19 can yield a differential output ranging from −700 to 700 V.

A detailed description will be given of the clock generator circuit 17, the ½ frequency divider circuit 18 and the high-voltage amplifier 19 which constitute the beam chopper circuit 16.

Clock Generator Circuit

Figure 4:
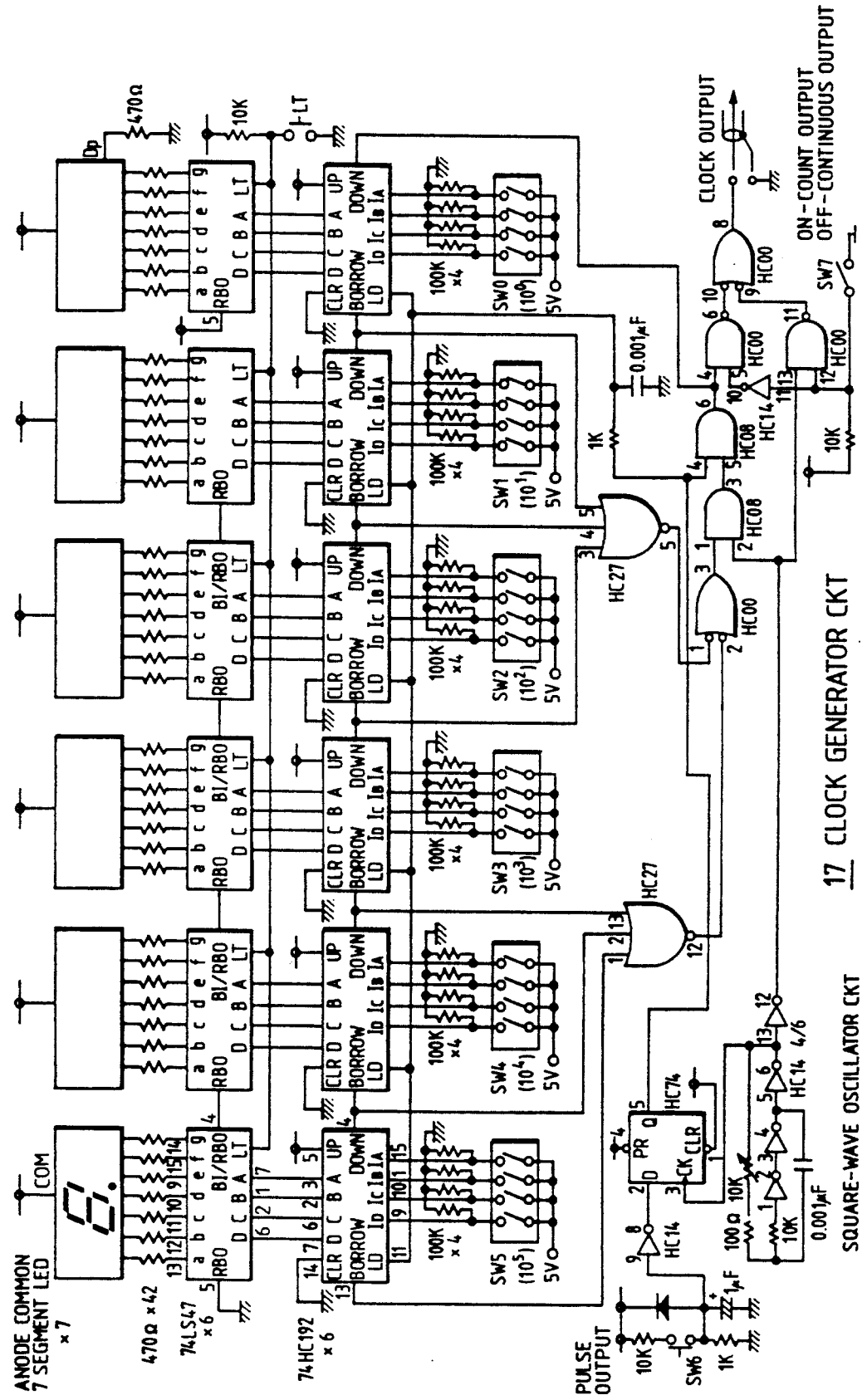
FIG. 4 is a circuit diagram of a clock generator circuit for use in the present invention.

FIG. 4 illustrates a circuit diagram of the clock generator circuit 17, which is formed by a square-wave oscillator circuit and six counter circuits. The square-wave oscillator circuit is comprised of inverters, resistors and a capacitor and is regulated to oscillate at 10 kHz.

The counter circuits each comprise a decimal counter IC, a decoder IC, a 7-segment numeral display LED and a digital switch.

The setting of the number of beam chopping operations is effected by means of digital switches SW0 through SW5. The digital switches SW0 through SW5 correspond to $10^0$-th through $10^5$-th digits, respectively, so that they represent binary number corresponding to a preset decimal number.

A switch SW7 is provided to select whether to continuously output clocks or to output a preset number of clocks. The switch SW7 is set in the off state in the case of continuously outputting clocks and in the on state in the case of outputting a preset number of clocks. Pressing (or turning on) a switch SW6 when the switch SW7 is on, a preset number of clocks are output via the switch SW7 from the instant the switch SW6 is released (or turned off).

½ Frequency Divider Circuit

Figure 5:
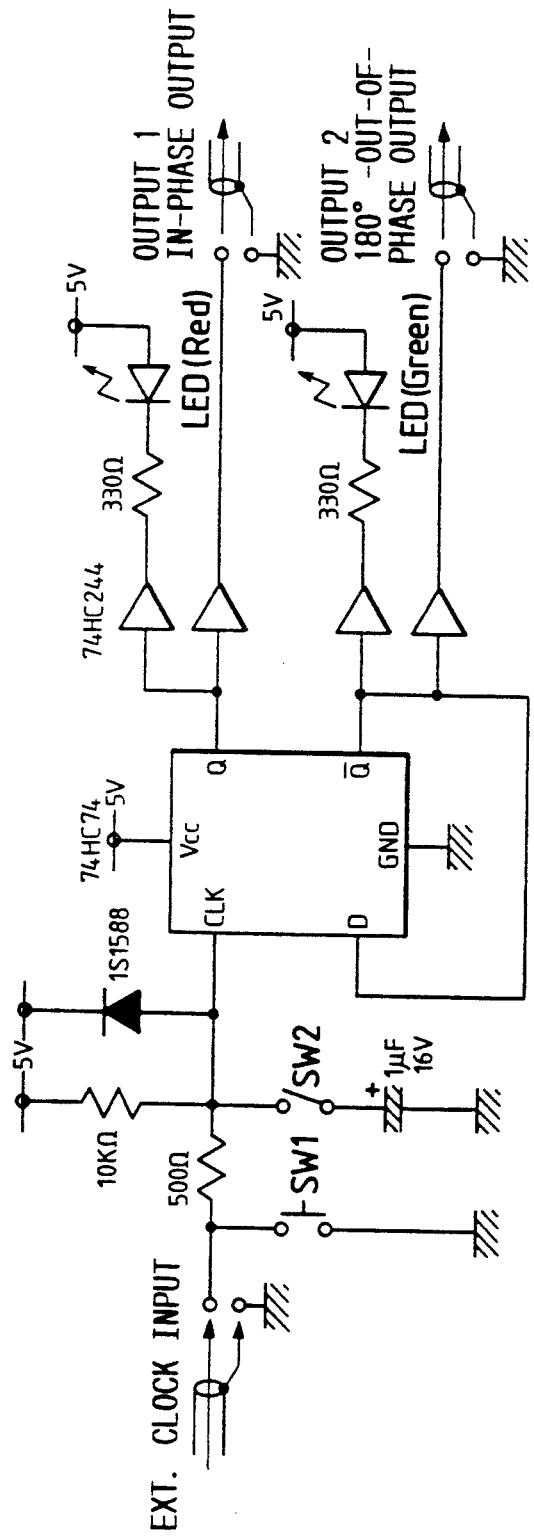
FIG. 5 is a circuit diagram of a ½ frequency divider circuit for use in the present invention.

FIG. 5 illustrates a circuit diagram of the ½ frequency divider circuit 18. The ½ frequency divider circuit 18 frequency divides an input clock down to ½ by a flip-flop so that one cycle of the input clock corresponds to one beam chopping operation. The circuit 18 is adapted to be capable of monitoring 180° out-of-phase outputs.

A switch SW1 is provided to manually input the clock into the flip-flop. A single chopping operation can be carried out without connecting the clock generator circuit 17 to the ½ frequency divider circuit 18.

A switch SW2 is provided to select whether to perform the beam chopping manually or to effect the beam chopping through use of the external clock. The switch SW2 is set in the on state in the case of the manual chopping and in the off state in the case of connecting the clock generator circuit 17 to the ½ frequency divider circuit 18 for beam chopping.

High Voltage Amplifier

Figure 6:
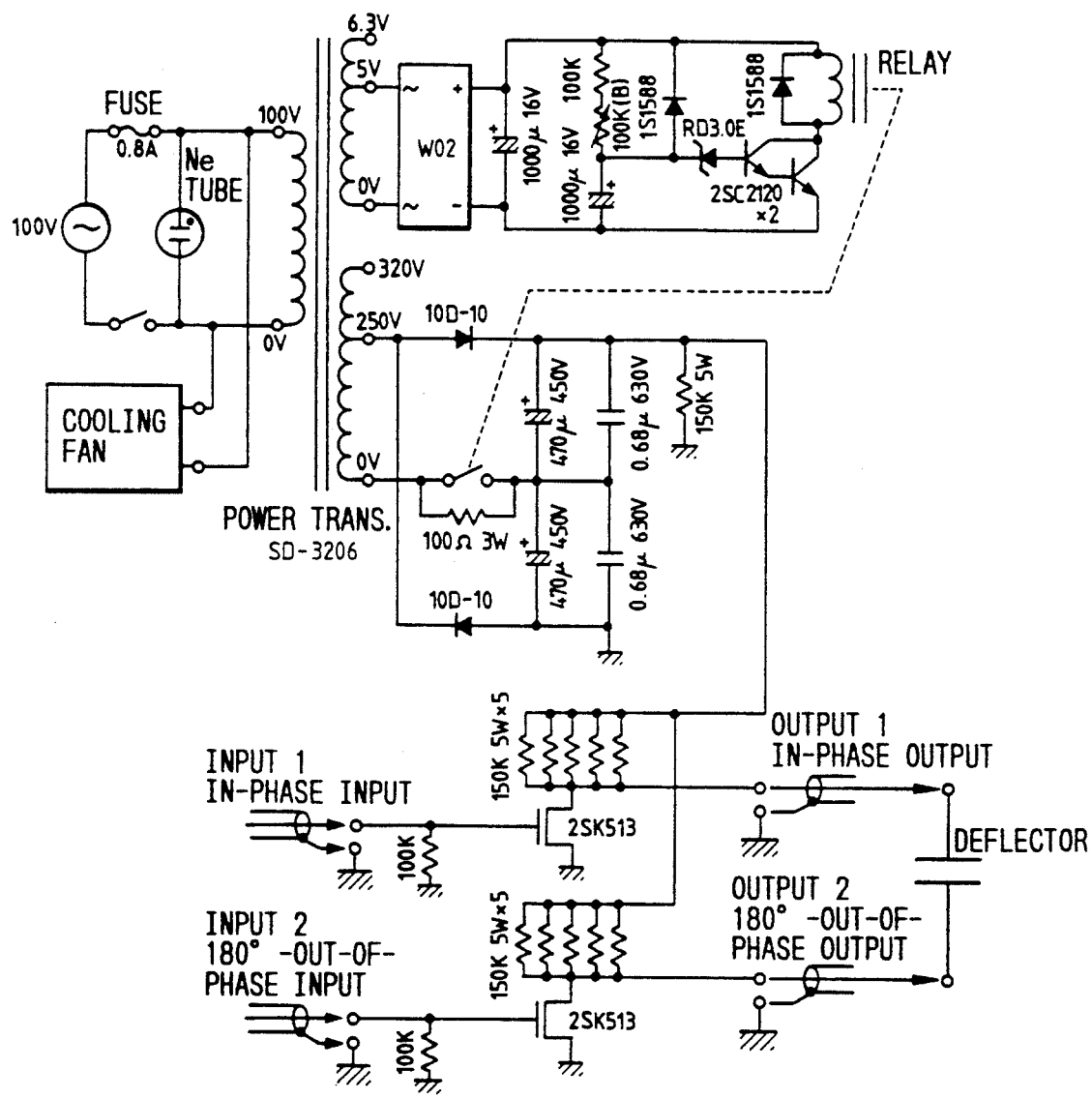
FIG. 6 is a circuit diagram of a high-voltage amplifier for use in the present invention.

FIG. 6 is a circuit diagram of the high-voltage amplifier 19. The high-voltage amplifier 19 switches high voltage by MOSFETs on the basis of 180° out-of-phase inputs. In general, the MOSFET does not delay in switching owing to the storage of minority carriers as in a bipolar transistor but has a parasitic capacitance between the drain and the gate. Since the switching time of the MOSFET is dependent on the product of the parasitic capacitance and a load resistance, the value of the load resistance needs to be minimized. In this high-voltage amplifier 19, five resistors are connected in parallel so as to minimize the value of the load resistance and solve a problem of its heat generation. As a result, power consumption is divided by the five resistors and the efficiency of heat removal is also improved.

The performance of the high-voltage amplifier 19 is shown in Table 2.

TABLE 2

| Performance of High-Voltage Amplifier | |
|---|---|
| Input voltage | 0.5 [V] |
| Output voltage | ±680 [V] |
| Switching time | 10 [μS] |

Figure 7:
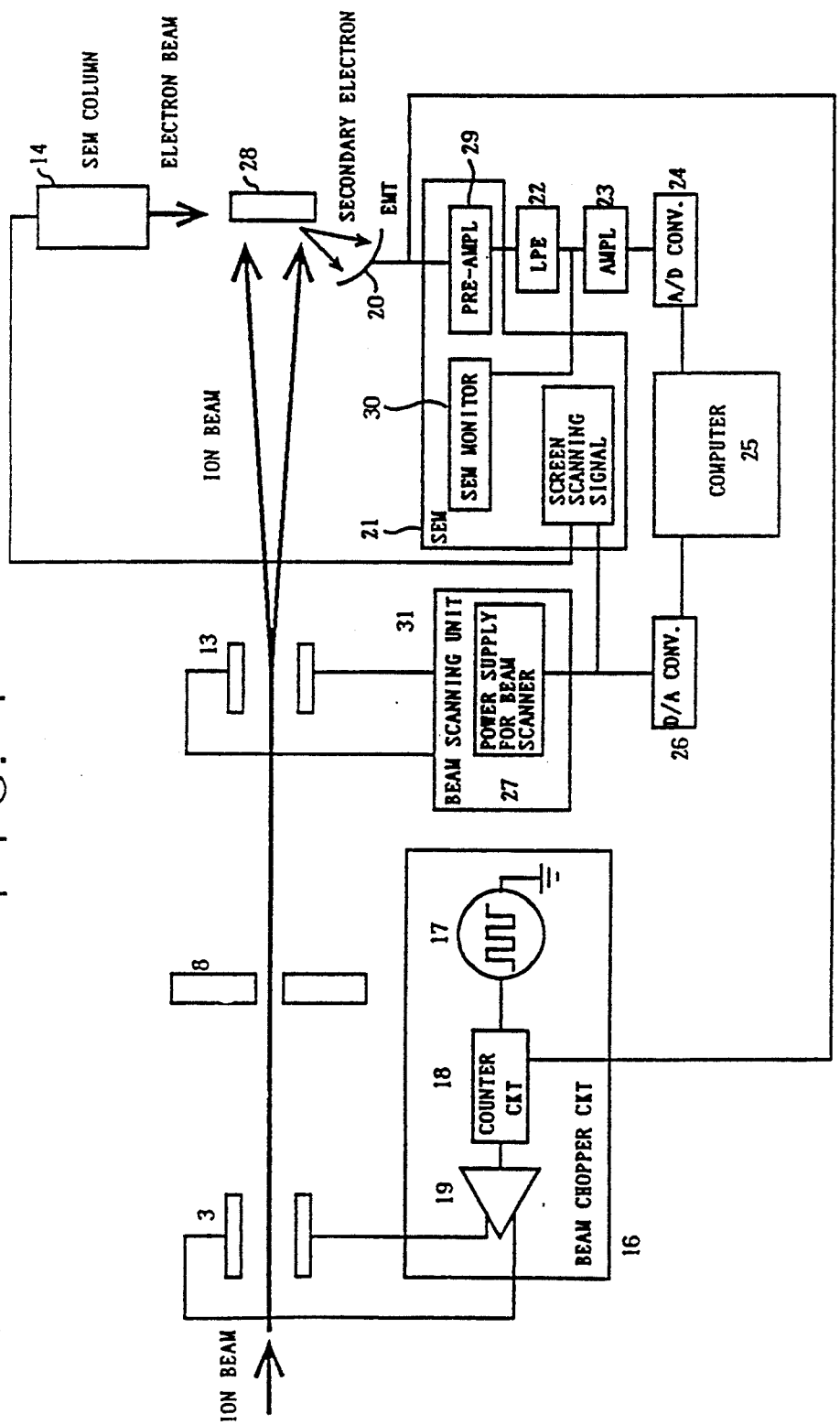
FIG. 7 is a schematic diagram showing the ion irradiation system including an SEM mechanism and secondary electron detecting system according to the present invention.

FIG. 7 illustrates in block form the schematic diagram showing the ion irradiation system including an SEM mechanism and secondary electron detecting system according to the present invention.

Said scanning electron microscope mechanism comprises;

a scanning electron microscope 21 including a preamplifier 29 connected to the output of said secondary electron multiplier 20, a scanning electron microscope monitor 30 and a screen scanning signal generator;

a beam scanning unit 31 having a beam scanning power supply 27 supplied with the one screen scanning signal from said screen scanning signal generator, for continuously scanning said ion microbeam;

a scanner deflector 13 connected to said beam scanning unit 31; and a scanning electron microscope column 14 supplied with the other screen scanning signal from said screen scanning signal generator, for generating an electron beam.

Said secondary electron detecting system comprises;

a low-pass 22 filter having its input connected to the output of said preamplifier 29 connected to said secondary electron multiplier 20 and having its one output connected to said scanning electron microscope monitor 30;

an amplifier 23 having its input connected to the other output of said low-pass filter 22;

an A/D converter 24 connected to said amplifier 23;

a computer system 25 connected to said A/D converter 24; and a D/A converter 26 having its input connected to said computer system 25 and having its output connected said beam scanning power supply 27.

Said scanning electron microscope mechanism includes a function for detecting, in real time, an image formed by secondary electrons emitted from the surface of said sample by its irradiation with said electron beam from said scanning electron microscope column 14 or said ion microbeam from said ion microprobe; and Said secondary electron beam detecting system is characterized in that said system detects an image formed by secondary electrons; said secondary electrons being emitted from said sample surface by irradiation of said sample surface with said electron beam, said ion microbeam and said single or predetermined number of ions.

Figure 8:
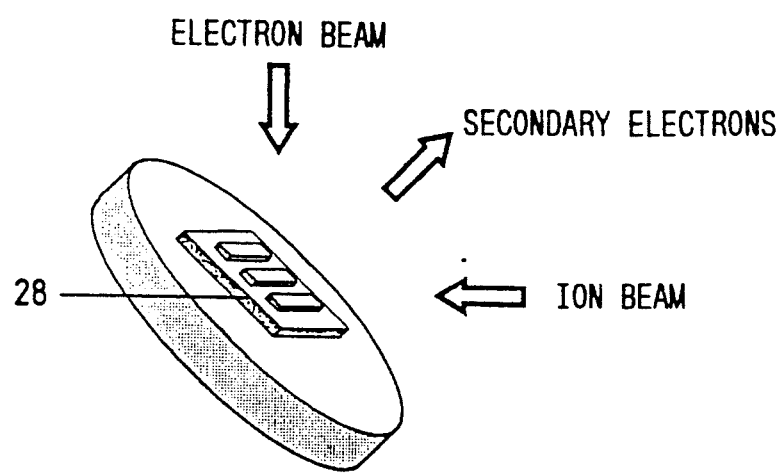
FIG. 8 is a diagram for explaining the irradiation of a sample by an ion beam and an electron beam and the emission of secondary electrons from the sample.

FIG. 8 is a schematic diagram for explaining the irradiation of the sample 28 with an ion beam or electron beam and the emission of secondary electrons from the sample 28. By irradiating the sample 28 with an ion beam or electron beam, secondary electrons are emitted from the sample 28. The amount of secondary electrons that are emitted from the sample 28 differs with its surface configuration (morphology). In the case of observing the sample surface through the SEM, the sample 28 is set by rotating the sample holder, at an angle of 90° with respect to the electron beam from the SEM column 14, and in the case of irradiating the sample with the ion beam, it is set at an angle of 90° thereto. That is, the rotational angle of the sample holder is variable. In this way, secondary electrons which are emitted from the sample surface in a direction substantially perpendicular thereto, by bombardment with the ion beam and the electron beam, can be detected by the above-described secondary electron detecting system.

Next, a description will be given of the ion irradiation method according to the present invention. According to the present invention, a predetermined number of ions extracted from an ion beam are applied to the surface of the sample 28 in the above-mentioned ion irradiation system (shown in FIGS. 1, 2 and 4) which comprises an ion microprobe (FIGS. 14 and 15);

a deflector 3 for deflecting an ion microbeam generated by said ion microprobe;

a micro slit 8 for extracting a single or predetermined number of ions from said ion microbeam deflected by said deflector;

a sample holder mechanism 28 for holding a sample to be irradiated with said single or predetermined number of ions extracted through said micro slit;

a scanning electron microscope mechanism for observing the surface of said sample in real time;

a secondary electron detecting system for detecting secondary electrons which are emitted from the surface of said sample, said secondary electron detecting system including a secondary electron multiplier 20; and an electric field control circuit 16 for controlling an electric field which is applied to said deflector 3, said electric field control circuit 16 being composed of a clock generator 17, a counter 18 connected to said clock generator 17 and a high-voltage amplifier 19 connected to said counter 18 and having its output connected to said deflector 3;

wherein said counter 18 counts output signal pulses from said secondary electron multiplier 20 and supplies a clock signal to said high-voltage amplifier 19 of said electric field control circuit 16 during counting of said single or predetermined number of ions and stops the supply of said clock signal to said high-voltage amplifier 19 upon completion of counting of said single or predetermined number of ions, whereby said ion microbeam is chopped by said deflector one or more times to instantaneously reverse its direction of deflection with respect to said micro slit 8, thereby extracting said single or predetermined number of ions through said micro slit 8.

The ion irradiation method according to the present invention comprises:

a first step of observing a secondary electron image over said sample surface through electron scanning by said scanning electron microscope mechanism to detect the positional relationship between a position of said sample surface which there is a desire to irradiate with said single or determined number of ions and a reference position on said sample or sample holder mechanism;

a second step of observing a secondary electron image at said reference point through ion microbeam scanning by said scanning electron microscope mechanism to determine the position for ion irradiation of said sample;

a third step of moving said sample holder mechanism by a distance based on said positional relationship detected in said first step to bring said position for ion irradiation of said sample into agreement with said position of said sample surface where to irradiate;

a fourth step of applying a bias voltage to said deflector from said electric field control circuit to chop said ion microbeam to permit the passage of said single or predetermined number of ions through said micro slit for only an extremely short period of time during which said ion microbeam is deflected across said micro slit widthwise thereof; and a fifth step of detecting secondary electrons emitted from said sample surface by irradiation with said single or predetermined number of ions to count the number of ions incident to said sample surface.

In the case where the probability of ions passing through said micro slit is so low that even a single ion is not allowed to pass through said micro slit by one reversal of the direction of deflection of said ion microbeam, said third and fourth steps are repeated until the number of ions passing through said micro slit reaches a predetermined number.

Figure 9:
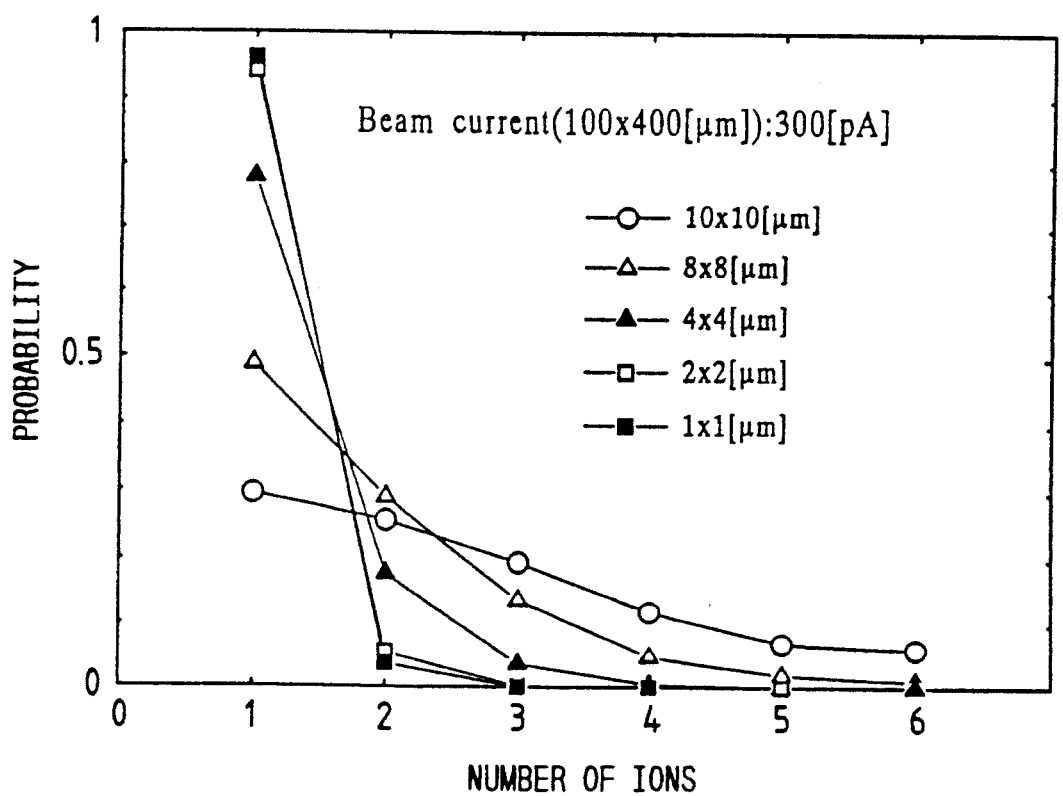
FIG. 9 is a graph showing the probability distribution of the number of extracted ions.
Figure 10:
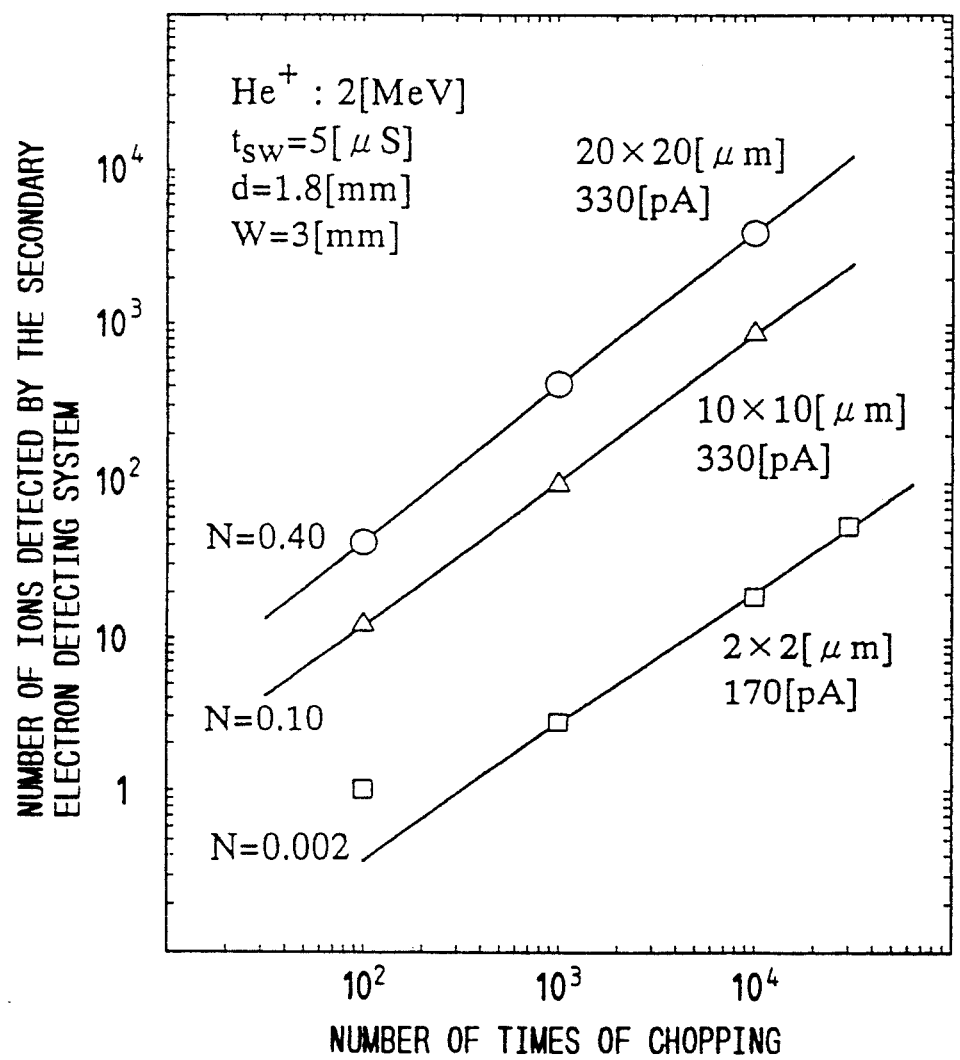
FIG. 10 is a graph showing the probability of extraction of ions.

By setting the number of ion beam chopping operations, the width of the micro-slit 8, the beam current of the ion microbeam and the beam spot diameter to predetermined values, one or desired number of ions can be extracted through the micro-slit 8 (see data shown in FIGS. 9 and 10).

Next, a description will be made giving of the results of evaluation of the accuracy of single ion extraction by beam chopping.

The inventors of this case have ascertained the extraction and application of one ion to the sample, by direct detection of ions incident to a solid state detector used as a target. In practice, however, a plurality of ions may sometimes be extracted and applied to the sample. No study had been given the relationship between the probability of two or more ions being applied to the sample and the slit width, the beam current, etc.

The distribution of the number of extracted ions was investigated by a multi-channel analyzer through utilization of the phenomenon that the solid state detector, when irradiated with extracted ions, yields an output voltage proportional to the number of ions applied thereto at the same time. The correlation of the probability distribution of the number of extracted ions to the slit width and the beam current was also investigated by the above-mentioned method for different values of the slit width and the beam current.

As a result, such a probability distribution of the number of extracted ions as shown in FIG. 9 was obtained. It is seen from FIG. 9 that when the slit is opened relatively large, the probability of two or more ions being extracted is high, but when the slit is set to an opening of $1 \times 1$ $\mu$m, the probability of two or more ions being extracted is virtually zero.

The probability of only one ion being extracted can be evaluated directly and quantitatively. The present invention ensures the irradiation of the sample with one ion.

The single ion generating technique is to extract only one ion from an ion beam, and according to the present invention, one or a desired number of ions are extracted by chopping the ion beam and applied to the sample as depicted in FIG. 1. FIG. 10 shows the relationship between the number of beam chopping operations and the number of ions extracted. It is seen from FIG. 10 that, by a suitable selection of the slit width and the beam current, the mean number of ions extracted is smaller than 1. By decreasing the slit width to reduce the ion extraction probability, it is almost possible to extract only one ion.

A description will be given of the results of investigation of radiation immunity mapping of a CMOS device through use of the ion irradiation system according to the present invention.

The inventors of this application ascertained that the single ion irradiation system of the present invention permits highly accurate irradiation of a target point with one ion and evaluation of the radiation immunity of the CMOS device for each site thereon. The inventors carried out mapping of a substrate current induced by single ions in the CMOS device by use of the single ion irradiation system according to the present invention.

In experiments of evaluating the single event effect, single ions were applied to the surface of a commercially available CMOS device (4049) at 100 $\mu$m intervals. Since the afore-mentioned latch-up of the CMOS device is caused by a current which instantaneously flows across the well and the substrate upon irradiation with an ion, the latch-up immunity of the device for each site was evaluated by measuring the amount of charges collected in the well for each irradiation. The ions usable in this case are $He^+$ of 3 MeV, $He^{2+}$ of 4 or 5 MeV.

The power supply of the CMOS device was supplied with a voltage for its actual operation, and single ions were applied to the CMOS device two-dimensionally while at the same time monitoring the current of the power supply. The amount of charges (hole-electron pairs) generated by the ions and collected by the power supply without being recombined were mapped.

Figure 11:
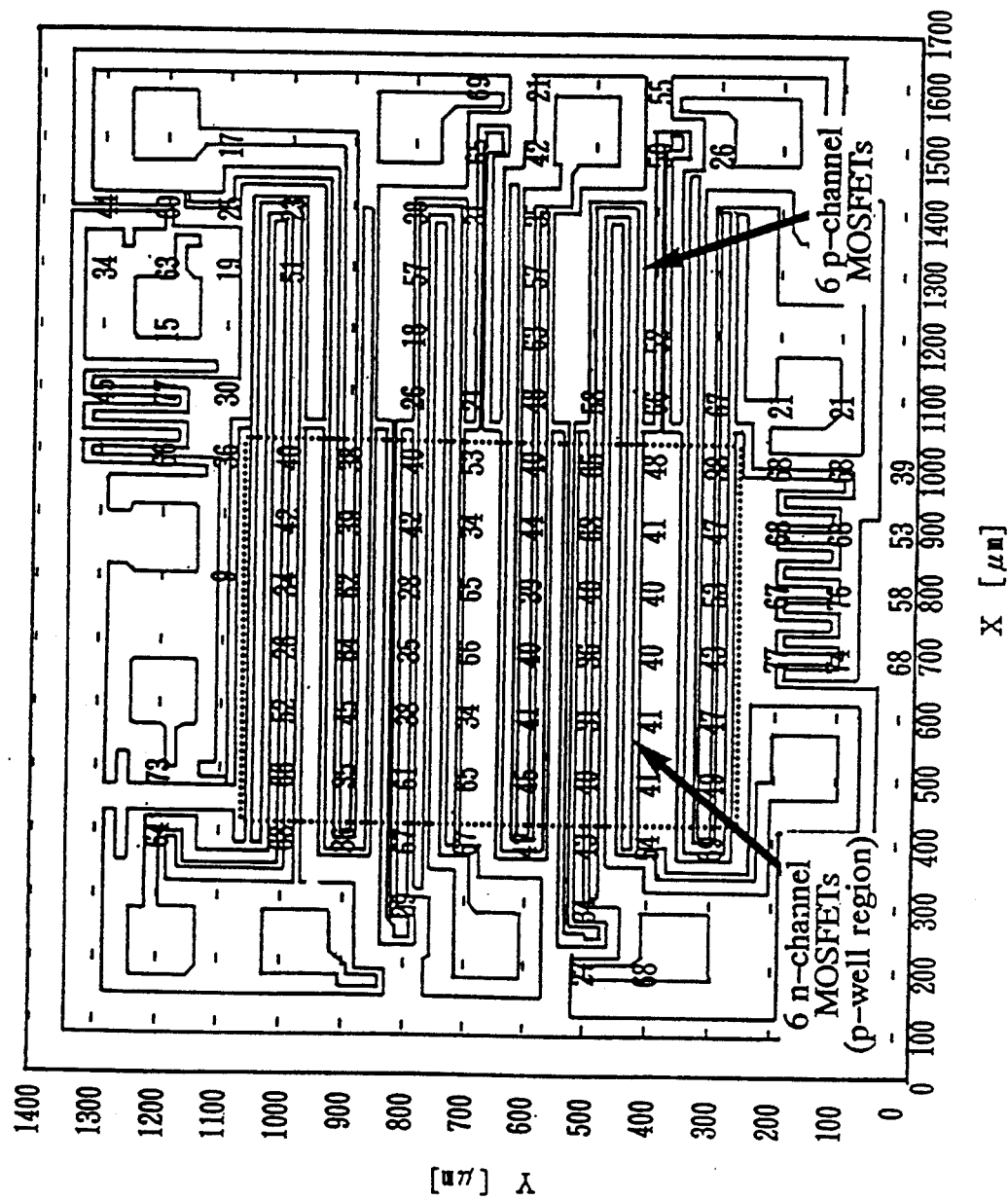
FIG. 11 is a diagram showing the amounts of charges collected when a CMOS inverter was irradiated with single ions.

FIG. 11 shows the charges collected when $He^+$ ions of a 3.0 MeV energy were used. It is considered that the larger the amount of collected charges, the lower the radiation immunity and the higher the possibility of incurring the latch-up. As shown in FIG. 11, the amount of collected charges is large over a region further to the left-hand side than the center of the chip, and it is considered that wells are fomed in this region.

Thus, the radiation immunity of the CMOS device was evaluated through use of the single ion irradiation system of the present invention, and as a result, the amounts of collected charges indicating the radiation immunity of the CMOS device could be mapped.

Accordingly, the present invention permits irradiation of extremely narrow sites on Ultra-Large Scale Integrated Circuits (ULSIs) with single ions.

The SEM sample holder may be used also to hold the sample to be irradiated with ions. The sample holder is an O ring seal, and hence is low in its positioning accuracy. It is also possible, in this case, to employ as a substitute for such a sample holder as a goniometer for determining the position of irradiation with high precision. The performance of the goniometer is as follows:

Positioning accuracy: within 1 $\mu$m

Number of axes: 6 (x, y, z, $\theta_x$, $\theta_y$, and $\theta_z$)

Whether the target has been irradiated with ions is judged by detecting secondary electrons emitted from the target through use of a secondary electron multiplier. However, the secondary electron multiplier has a background noise, which incurs the possibility of misleading the judgement on the extraction of single ions. Moreover, in the case of simultaneously irradiating the target with a plurality of ions, it is impossible with the secondary electron multiplier to achieve a quantative evaluation of the number of ions applied—this poses a problem that the extraction of single ions cannot be confirmed. As regards the former, the presence or absence of an ion or ions extracted could by judged by checking the timing or temporal synchronization between the output from the secondary electron multiplier and an ion beam reversing signal. As regards the latter, the condition for irradiation with one ion was obtained by quantitative evaluation of the number of ions extracted, using a solid-state detector (SSD).

The results of direct verifications of incidence of single ions on the solid state detector for evaluating the reliability of the single ion irradiation system are set forth in T. Matsukawa et al., "Reliability of single ion hitting system (I)," Proc. of '91 Autumn Meeting of the Society of Applied Physics of Japan, 29p-ZD-9, pp. 5. The method set forth in the above literature uses a solid state detector as the target, and hence clearly differs from the method of the present invention which irradiates a semiconductor device with ions. The detection of single ions is effected by detecting secondary electrons emitted from desired target, but this method is an indirect method and does not directly detect the incidence of ions to the target. Then, the incidence of single ions to the solid state detector was directly verified with a view to improving the reliability of the single ion irradiation system.

The solid state detector was irradiated with single ions extracted by beam chopping. A preamplifier was connected to the solid state detector and its output waveform was observed through a storage oscilloscope.

It was found that the use of the solid state detector allows direct measurement of the number of ions incident to the target and that a small slit width ensures extraction of single ions. Furthermore, when the slit width was large, a plurality of ions could be extracted at the same time.

Figure 12:
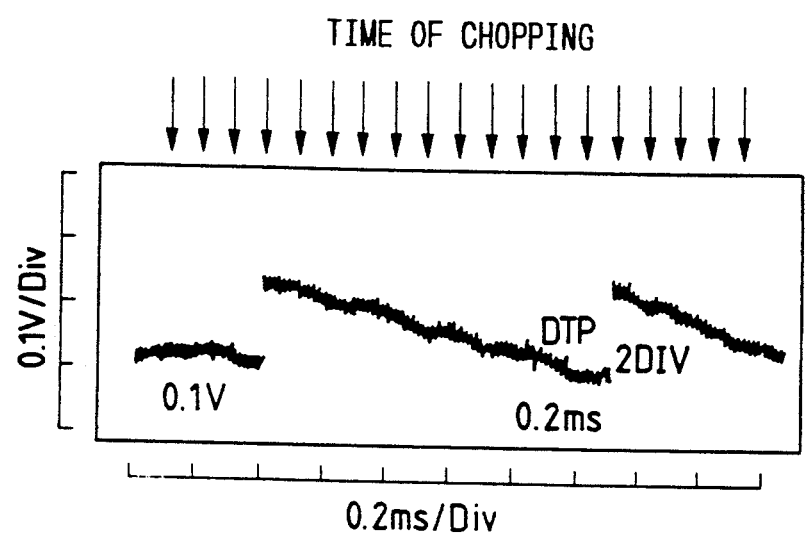
FIG. 12 is a diagram showing SSD output waveforms resulting from continuous chopping of an ion beam.
Figure 13:
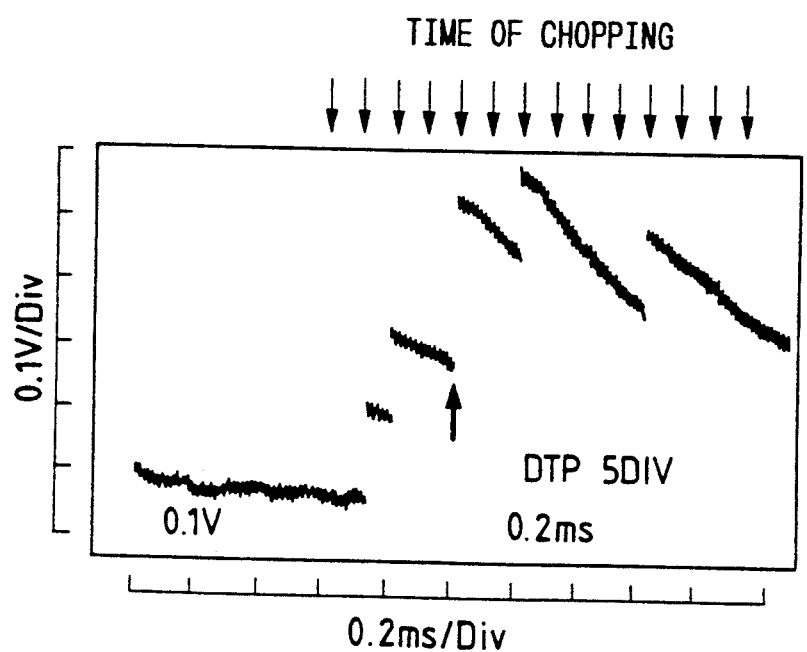
FIG. 13 is a diagram showing SSD output waveforms during the extraction of one or more ions.

FIGS. 12 and 13 show output waveforms of the preamplifier connected to the solid state detector used as the target. FIG. 12 shows the output of the preamplifier when the slit width was $10 \times 10$ μm, and the point of a discontinuous rise-up of the waveform is the instant of the incidence of a single ion to the target. With this slit width, the same waveform of the same peak value appears even if sampling is repeated—this indicates that the ions extracted are single ions individually. As the result of repeated beam chopping, ions were sporadically applied to the solid state detector and the resulting two output pulses happened to be recorded on the oscilloscope. The time interval between the two output pulses is 1.1 ms, but the time interval between a plurality of pulses, detected by repeating sampling, was always an integral multiple of 0.1 ms. The time interval between beam chopping operations at 10 kHz is 0.1 ms, from which it is seen that the ion extraction is completely synchronized with the frequency of beam chopping. That is, ions applied to the target at this time are all ions extracted by beam chopping.

FIG. 13 shows the output waveforms of the preamplifier in the case where the slit was open as wide as $2000 \times 200$ μm to extract a plurality of ions by one chopping. It is seen from FIG. 13 that the pulse interval is an integral multiple of 0.1 ms and the ion extraction is synchronized with the beam chopping, as in the case of FIG. 12. Moreover, a voltage change at one of discontinuous portions of the waveforms is twice as large as voltage changes at the other discontinuous portions. The instant the voltage undergoes such a change, two ions are simultaneously applied to the target. In this case, however, the slit opening is very larger than in the case of extracting single ions, and two ions will not be extracted by one beam chopping unless the slit is opened so wide.

The present invention allows testing the radiation resistance of semiconductor devices. As the result of development of the ion beam focusing technique, the beam aiming technique and the single ion extracting technique, it is possible to apply single ions to desired sites on semiconductor devices and artificially induce malfunction.

The present invention enables only one ion to be applied with desired energy to each site of one integrated circuit, and hence is applicable to the evaluation of the radiation resistance of that site by artificially causing malfunction (such as the afore-mentioned latch-up of a CMOS and soft error of a DRAM).

According to the present invention, only one ion can be applied to a target position with high accuracy, it is possible to measure the radiation immunity of a semiconductor device for each site and hence specify a position where malfunction is likely to occur.

With the present invention, single high-energy ions can be applied to desired position on a fine-structured target such as a large scale integrated circuit or living cell. That is, it is possible, with the present invention, to artificially cause malfunction of integrated circuits which are induced by high-energy ions sporadically occurring as natural phenomena under the actual environmental conditions in space or on the earth.

According to the present invention, the difference in the manner in which malfunction is caused at different sites of one integrated circuit can be investigated by applying only one ion to each site, and accordingly, it is possible to obtain highly accurate information for increasing the durability of the circuit.

The most important use of the application of radiation according to the present invention is radiation treatment of cancer. It is said that cells which rapidly multiply, such as cancer cells, are particularly influenced by radiation. Also in our country, much study is being given radiation treatment of cancer and the investigation of the influence of ion irradiation on each cell will help develop better cures for cancer. The system of the present invention is useful therefor. The following table shows the application of irradiation with radiation.

TABLE 3

| | Method of Use |
|---|---|
| Sterilization | Sterilization of medical instruments and supplies, sterilization of food, extermination of harmful insects |
| Killing insects | |
| Preservation | prevention of germination, control of maturity |
| Rearing | improvement of species, control of growth |
| Treatment | treatment of cancer, treatment of tumors, treatment of the thyroid gland |
| Biochemistry | research in genetic engineering, development of new medicine |

Since the ion irradiation technique according to the present invention permits irradiation of small organs in living cells with radiation, it is also expected that the invention will help find out the mechanism of a cancerous change of normal cells by use of high-energy ions.

It will be apparent that many modifications and variations may be effected without departing from the scope of the novel concepts of the present invention.

What is claimed is:

1. An ion irradiation system comprising:
   an ion microprobe,
   a deflector for deflecting an ion microbeam generated by said ion microprobe;
   a micro slit for extracting a single or predetermined number of ions from said ion microbeam deflected by said deflector;
   a sample holder mechanism for holding a sample to be irradiated with said single or predetermined number of ions extracted through said micro slit;

a scanning electron microscope mechanism for observing the surface of said sample in real time;

a secondary electron detecting system for detecting secondary electrons which are emitted from the surface of said sample, said secondary electron detecting system including a secondary electron multiplier; and an electric field control circuit for controlling an electric field which is applied to said deflector, said electric field control circuit being composed of a clock generator, a counter connected to said clock generator and a high-voltage amplifier connected to said counter and having an output connected to said deflector;

wherein said counter counts output signal pulses from said secondary electron multiplier and supplies a clock signal to said high-voltage amplifier of said electric field control circuit during counting of said single or predetermined number of ions and stops the supply of said clock signal to said high-voltage amplifier upon completion of counting of said single or predetermined number of ions, whereby said ion microbeam is chopped by said deflector one or more time to instantaneously reverse its direction of deflection with respect to said micro slit, thereby extracting said single or predetermined number of ions through said micro slit.

2. The ion irradiation system of claim 1 wherein the number of times of chopping of said ion microbeam by said deflector, the width of said micro slit, a beam current of said ion microbeam and the spot diameter of said ion microbeam are set to predetermined values to extract one or desired number of ions through said micro slit.

3. The ion irradiation system of claim 1 wherein said sample holder mechanism includes a goniometer having a positioning accuracy of 1 μm and having six axes (x, y, z, $\theta_x$, $\theta_y$, $\theta_z$).

4. The ion irradiation system of claim 1 wherein said scanning electron microscope mechanism comprises;

a scanning electron microscope including a preamplifier connected to an output of said secondary electron multiplier, a scanning electron microscope monitor and a screen scanning signal generator;

a beam scanning unit having a beam scanning power supply supplied with a screen scanning signal from said screen scanning signal generator, for continuously scanning said ion microbeam;

a scanner deflector connected to said beam scanning unit; and a scanning electron microscope column supplied with the other screen scanning signal from said screen scanning signal generator, for generating an electron beam;

wherein said secondary electron detecting system comprises:

a low-pass filter having an input connected to an output of said preamplifier connected to said secondary electron multiplier and having an output connected to said scanning electron microscope monitor;

an amplifier having an input connected to another output of said low-pass filter;

an A/D converter connected to said amplifier;

a computer system connected to said A/D converter; and a D/A converter having an input connected to said computer system and having an output connected to said beam scanning power supply;

wherein said scanning electron microscope mechanism detects, in real time, an image formed by secondary electrons emitted from the surface of said sample by its irradiation with said electron beam from said scanning electron microscope column or said ion microbeam from said ion microprobe; and wherein said secondary electron beam detecting system detects secondary electrons said secondary electrons emitted from said sample surface by irradiation with said electron beam, said ion microbeam and said single or predetermined number of ions.

5. The ion irradiation system of claim 1 wherein said sample of sample holder mechanism has a reference position for obtaining a positional relationship to a position on said sample surface which there is a desire to irradiate with said single or predetermined number of ions, through use of said scanning electron microscope mechanism.

6. The ion irradiation system of claim 5 wherein an ultrafine-structured silicon test pattern is placed at said reference position for measuring the position of incidence of said ion microbeam to said sample and the spot size of said ion microbeam.

7. An ion irradiation method for an ion irradiation system which comprises: an ion microprobe;

a deflector for deflecting an ion microbeam generated by said ion microprobe;

a micro slit for extracting a single or predetermined number of ions from said microbeam deflected by said deflector;

a sample holder mechanism for holding a sample to be irradiated with said single or predetermined number of ions extracted through said micro slit;

a scanning electron microscope mechanism for observing the surface of said sample in real time;

a secondary electron detecting system including a secondary electron multiplier, for detecting secondary electrons emitted from said sample surface;

and an electric field control circuit for controlling an electric field which is applied to said deflector, said electric field control circuit being composed of a clock generator, a counter connected to said clock generator and a high-voltage amplifier connected at an input to said counter and at an output to said deflector, and wherein said counter counts output signal pulses from said secondary electron multiplier and supplies said field control circuit during counting of said single or predetermined number of ions and stops the supply of said clock signal to said high-voltage amplifier upon completion of counting of said single or predetermined number of ions, whereby said ion microbeam is chopped by said deflector one or more times to instantaneously reverse its direction of deflection with respect to said micro slit to thereby extract therethrough said single or predetermined number of ions;

said method comprising;

a first step of observing a secondary electron image over said sample surface through electron scanning by said scanning electron microscope mechanism to detect the positional relationship between a position of said sample surface which there is a desire to irradiate with said single or determined number of ions and a reference position on said sample or sample holder mechanism;

a second step of observing a secondary electron image at said reference point through ion microbeam scanning by said scanning electron microscope mechanism to determine the position for ion irradiation of said sample;

a third step of moving said sample holder mechanism by a distance based on said positional relationship detected in said first step to bring said position for ion irradiation of said sample into agreement with said position for ion irradiation of said sample;

a fourth step of applying a bias voltage to said deflector from said electric field control circuit to chop said ion microbeam to permit the passage of said single or predetermined number of ions through said micro slit for only an extremely short period of time during which said ion microbeam is deflected across said micro slit widthwise thereof; and a fifth step of detecting secondary electrons emitted from said sample surface by irradiation with said single or predetermined number of ions to count the number of ions incident to said sample surface.

8. The ion irradiation method of claim 7 wherein when the probability of ions passing through said micro slit is so low that even a single ion is not allowed to pass through said micro slit by one reversal of the direction of deflection of said ion microbeam, said third and fourth steps are repeated until the number of ions passing through said micro slit reaches a predetermined number.

9. The ion irradiation method of claim 7 or 8 wherein the number of times of chopping of said ion microbeam by said deflector, the width of said micro slit, a beam current of said ion microbeam and the spot diameter of said ion microbeam are set to predetermined values to extract one or desired number of ions through said micro slit.

* * * * *